(12) United States Patent
Kanamaru et al.

(10) Patent No.: US 9,318,346 B2
(45) Date of Patent: *Apr. 19, 2016

(54) CMP POLISHING LIQUID AND POLISHING METHOD

(71) Applicant: HITACHI CHEMICAL COMPANY., LTD., Tokyo (JP)

(72) Inventors: Mamiko Kanamaru, Hitachi (JP); Tomokazu Shimada, Hitachi (JP); Takashi Shinoda, Toukai-mura (JP)

(73) Assignee: HITACHI CHEMICAL COMPANY, LTD., Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 14/468,688

(22) Filed: Aug. 26, 2014

(65) Prior Publication Data

US 2014/0363973 A1 Dec. 11, 2014

Related U.S. Application Data

(63) Continuation of application No. 13/376,431, filed as application No. PCT/JP2010/063811 on Aug. 16, 2010, now Pat. No. 8,883,031.

(30) Foreign Application Priority Data

Aug. 19, 2009 (JP) .................................. 2009-190422

(51) Int. Cl.
*H01L 21/321* (2006.01)
*C09G 1/02* (2006.01)
*C09K 3/14* (2006.01)

(52) U.S. Cl.
CPC .............. *H01L 21/3212* (2013.01); *C09G 1/02* (2013.01); *C09K 3/1463* (2013.01); *C09K 3/1472* (2013.01)

(58) Field of Classification Search
None
See application file for complete search history.

(56) References Cited

U.S. PATENT DOCUMENTS 4,944,836 A   7/1990 Beyer et al.
4,954,142 A   9/1990 Carr et al.
(Continued)

FOREIGN PATENT DOCUMENTS

CN   101058711 A   10/2007
CN   101177603 A    5/2008
(Continued)

OTHER PUBLICATIONS

International Search Report of PCT/JP2010/063811, mailing date of Nov. 16, 2010.
(Continued)

*Primary Examiner* — Shamim Ahmed
(74) *Attorney, Agent, or Firm* — Westerman, Hattori, Daniels & Adrian, LLP

(57) ABSTRACT

The CMP polishing liquid containing a medium and silica particles as an abrasive grain dispersed into the medium. The silica particles have a silanol group density of $5.0/nm^2$ or less and the biaxial average primary particle diameter when arbitrary 20 silica particles are selected from an image obtained by scanning electron microscope observation is 25 to 55 nm. The association degree of the silica particles is 1.1 or more. The CMP polishing liquid has the high barrier film polishing speed, the favorable abrasive grain dispersion stability, and the high interlayer dielectric polishing speed. The CMP polishing liquid can provide a method of producing semiconductor substrates or the like, that have excellent microfabrication, thin film formation, dimension accuracy, electric property and high reliability with low cost.

37 Claims, 4 Drawing Sheets

(56) References Cited

U.S. PATENT DOCUMENTS

| | | | |
|---|---|---|---|
| 5,352,277 | A | 10/1994 | Sasaki |
| 2006/0276041 | A1 | 12/2006 | Uchikura et al. |
| 2007/0181850 | A1* | 8/2007 | Kamimura et al. .......... 252/79.1 |
| 2007/0293049 | A1 | 12/2007 | Minamihaba et al. |
| 2008/0206995 | A1* | 8/2008 | Tomiga et al. ................ 438/693 |
| 2008/0242090 | A1 | 10/2008 | Yamada et al. |
| 2008/0318427 | A1 | 12/2008 | Kunitani et al. |
| 2009/0004863 | A1 | 1/2009 | Kamimura |
| 2009/0124172 | A1 | 5/2009 | Uchikura et al. |
| 2009/0246956 | A1 | 10/2009 | Takamiya et al. |

FOREIGN PATENT DOCUMENTS

| | | | |
|---|---|---|---|
| EP | 0373501 | A2 | 6/1990 |
| EP | 1541653 | A1 | 6/2005 |
| JP | 2-158684 | A | 6/1990 |
| JP | 2-278822 | A | 11/1990 |
| JP | 2001-31950 | A | 2/2001 |
| JP | 3397501 | B2 | 4/2003 |
| JP | 2006-026885 | A | 2/2006 |
| JP | 2006-196508 | A | 7/2006 |
| JP | 2006-310596 | A | 11/2006 |
| JP | 2008-235714 | A | 10/2008 |
| JP | 2009-027142 | A | 2/2009 |
| JP | 2009-088182 | A | 4/2009 |
| JP | 2009-147394 | A | 7/2009 |
| JP | 2009-158810 | A | 7/2009 |
| TW | 200613533 | A | 5/2006 |
| TW | 200837822 | A | 9/2008 |
| WO | 03/038883 | A1 | 5/2003 |

OTHER PUBLICATIONS

Kaufman, F.B. et al., "Chemical-Mechanical Polishing for Fabricating Patterned W Metal Features as Chip Interconnects", Journal of Electrochemical Society, Nov. 1991, pp. 3460-3464, vol. 138, No. 11.
Notification of Transmittal of Translation of the International Preliminary Report on Patentability (Form PCT/IB/338) of International Application No. PCT/JP2010/063811 mailed Mar. 22, 2012 with Forms PCT/IB/373 and PCT/ISA/237.
Japanese Office Action dated Dec. 19, 2012, issued in corresponding Japanese patent application No. 2012-235874, w/ English translation. (6 pages).
Japanese Office Action dated May 14, 2013, issued in corresponding Japanese Patent Application No. 2012-235874, w/ English Translation. (6 pages).
Chinese Office Action dated Dec. 25, 2013, issued in corresponding Chinese application No. 201080022988.1, w/ English translation. (25 pages).
Notification of Reason(s) for Refusal dated Jan. 7, 2014, issued in corresponding Japanese application No. 2012-235875, w/ English translation. (7 pages).
Chinese Office Action dated Jul. 11, 2014, issued in corresponding Chinese Patent Application No. 201080022988.1 w/ English translation. (25 pages).
Taiwanese Office Action dated Aug. 11, 2014, issued in counterpart Taiwanese Patent Application No. 099127593, w/English translation (18 pages).
Office Action dated Feb. 27, 2015, issued in corresponding Chinese Application No. 20108002988.1, w/English translation. (7 pages).
Notification of Reason(s) for Refusal dated dated Apr. 7, 2015, issued in corresponding Japanese Patent Application No. 2014-038549, with English translation (9 pages).

* cited by examiner

CMP POLISHING LIQUID AND POLISHING METHOD

CROSS-REFERENCE TO RELATED APPLICATIONS

This is a continuation application of U.S. patent application Ser. No. 13/376,431 filed on Dec. 6, 2011, now U.S. Pat. No. 8,883,031, which is a 371 of International Application No. PCT/JP2010/063811, filed on Aug. 16, 2010, which claims the benefit of priority from the prior Japanese Patent Application No. 2009-190422, filed on Aug. 19, 2009, the entire contents of which are incorporated herein by reference.

TECHNICAL FIELD

The present invention relates to a CMP polishing liquid and a polishing method to be used for polishing a semiconductor substrate wiring formation step and the like.

BACKGROUND ART

Microfabrication technologies have recently been developed in order to attain high integration and high performance of a semiconductor integrated circuit (hereinafter referred to as LSI). A chemical mechanical polishing (hereinafter referred to as CMP) method is one of the technologies, which is often used for flattening interlayer dielectrics, metal plug formation, and embedded wiring formation in a multilayer wiring formation step. The technology is disclosed in Patent Publication 1, for example.

Also, in order to attain the high performance of LSI, use of copper or a copper alloy as a conductive material for a wiring material has recently been tried. However, it is difficult to perform microfabrication of copper or copper alloy by employing the dry etching method which has often been employed for conventional aluminum alloy wiring formation.

Accordingly, a so-called damascene method, in which a thin film of copper or copper alloy is deposited on an insulation film on which grooves are formed, and the thin film except for the groove portions is removed by CMP to form an embedded wiring, has predominantly been employed. The technology is disclosed in Patent Publication 2, for example.

In an ordinary method of CMP of a metal, which is employed for polishing a conductive material such as copper and a copper alloy used as a wiring metal, a polishing cloth (pad) is attached to a circular polishing plate (platen); a metal film formed on a substrate is pressed to a surface of the polishing pad while the surface of the polishing pad is impregnated with a CMP polishing liquid; the polishing platen is rotated in a state where a predetermined pressure (hereinafter referred to as polishing pressure) is applied to the metal film from a reverse side of the polishing pad; and the metal film on a convex portion is removed by relative mechanical abrasion between the CMP polishing liquid and the convex portion of the metal film.

The CMP polishing liquid used in the metal CMP is generally formed of an oxidizing agent and an abrasive grain, and an oxidized-metal dissolving agent and a protective film-forming agent are further added as required. Conductive material surfaces are oxidized by the oxidizing agent, and the generated oxidized conductive material film is ground by the abrasive grain, which is the basic mechanism.

Since the oxidized conductive material film on the surface of a concave portion is scarcely in contact with the polishing pad, the effect of polishing by the abrasive grain does not exerted on the oxidized conductive material film, and the substrate surface is flattened by removal of the conductive material on the convex portion along with a progress of CMP. Details are disclosed in Non-Patent Publication 1, for example.

It is known that addition of the oxidized-metal dissolving agent is effective as one of the methods for increasing a speed of the polishing by CMP. It is understood that the grinding effect of the abrasive grain is enhanced when grains of the oxidized conductive material polished off by the abrasive grain are dissolved (hereinafter referred to as etching) into the CMP polishing liquid.

Though the CMP polishing speed is improved by the addition of oxidized-metal dissolving agent, the conductive material surface is further oxidized by the oxidizing agent when the conductive material surface is exposed by the etching on the oxidized conductive material in the convex portion. The etching on the conductive material in the convex portion progresses when the oxidization is repeated. Therefore, the flattening effect is impaired by a phenomenon that a central portion of the surface of the conductive material which is embedded after the polishing is depressed like a dish (hereinafter referred to as dishing).

Addition of a protective film-forming agent for the purpose of preventing the dishing is known. The protective film-forming agent is capable of forming a protective film on the oxidized film on the conductive material surface to thereby prevent the oxidized film from being dissolved into the CMP polishing liquid. It is desirable that the protective film is easily ground with the use of the abrasive grain and does not reduce the CMP polishing speed.

In order to suppress the dishing and corrosion during polishing of the conductive material and to form a high-reliability LSI wiring, a method of using an oxidized-metal dissolving agent selected from aminoacetic acids and amidosulfuric acids and a CMP polishing liquid containing BAT (benzotriazole) as the protective film-forming agent has been proposed. The technology is described in Patent Publication 3, for example.

Meanwhile, as shown in FIG. 1(a), a barrier conductive film 2 (hereinafter refereed to as barrier film) for preventing copper diffusion into interlayer dielectrics 1 and for improving adhesion is formed below a conductive material 3 formed of a wiring metal such as copper and a copper alloy. Therefore, it is necessary to eliminate the exposed barrier film 2 by CMP on portions other than the wiring portion in which the conductive material is embedded. However, since a conductor used for the barrier film 2 has higher hardness as compared to the conductive material, it is difficult to attain a satisfactory polishing speed even when a polishing material for conductive material is used in combination, and the flatness is often deteriorated.

Therefore, a two-step polishing method has been studied, in which the process is divided into "first polishing step" of polishing the conductive material 3 from the state shown in FIG. 1(a) to the state shown in FIG. 1(b) and "second polishing step" of polishing the barrier film 2 from the state shown in FIG. 1(b) to the state shown in FIG. 1(c). Also, in order to improve the flatness of the surface after termination of the polishing, apart of a convex portion of the interlayer dielectrics 1 is generally polished in the second polishing step, which is called "overpolishing".

CITATION LIST

Patent Documents

Patent Document 1: U.S. Pat. No. 4,944,836
Patent Document 2: Japanese Patent No. 1969537
Patent Document 3: Japanese Patent No. 3397501

Non-Patent Document

Non-Patent Document 1: Journal of Electrochemical Society; 1991; Vol. 138; No. 11; p. 3460-3464.

DISCLOSURE OF THE INVENTION

Problems to be Solved by the Invention

In the second polishing step, in the case of performing the overpolishing on the interlayer dielectrics, a polishing speed for the interlayer dielectrics 1 may preferably be high in addition to a polishing speed for the barrier film 2 in order to improve a throughput by the reduction in polishing step time. In order to improve the polishing speed for the interlayer dielectrics 1, means of increasing a grain size of the abrasive grain in the CMP polishing liquid and increasing a content of the abrasive grain in the CMP polishing liquid may be considered.

However, both of the above means tend to deteriorate dispersion stability of the abrasive grain to allow sedimentation of the abrasive grain. Therefore, in the case where the CMP polishing liquid is used after being stored for a certain period of time, the polishing speed for the interlayer dielectrics tends to be lowered to cause a problem of difficulty in attaining the flatness.

Therefore, there is a demand for a CMP polishing liquid which has the same barrier film polishing speed as compared to the conventional CMP polishing liquid for a barrier film, a satisfactorily rapid polishing speed for the interlayer dielectrics, and excellent abrasive grain dispersion stability.

Since the mechanical action by the abrasive grain is enhanced in each of the means, a phenomenon (hereinafter referred to as "seam") in which the interlayer dielectrics 1 near the barrier film 2 is excessively polished as if they are scooped off tends to occur. When the seam occurs, a problem of an increase in wiring resistance or the like is raised. The problem will be grave when a degree of "scaling" (multilayer formation in LSI wiring structure) is increased. Since a wiring sectional area is reduced along with the increase in scaling, a film thickness of the inter-wiring insulating film is reduced to be influenced by a very small seam.

Therefore, there is a demand for a CMP polishing liquid which has a barrier film polishing speed which is similar to that of the conventional barrier film CMP polishing liquid and a satisfactorily rapid polishing speed for the interlayer dielectrics and does not cause the seam after the polishing.

In view of the above-described problems, an object of the present invention is to provide a CMP polishing liquid which has a high barrier film polishing speed, is capable of polishing interlayer dielectrics at a high speed, and enables favorable abrasive grain dispersion stability in the CMP polishing liquid.

Also, in view of the above, another object of the present invention is to provide a CMP polishing liquid which has a high barrier film polishing speed, is capable of polishing interlayer dielectrics at a high speed, and enables to suppress a flatness-related problem such as seam.

Also, yet another object of the present invention is to provide a polishing method in production of semiconductor substrates and the like which are excellent in microfabrication, thin film formation, dimension accuracy, and electric property and are of high reliability and a low cost.

Means for Solving the Problems

The present invention has selected to use silica particles as an abrasive grain as a result of various researches in the aim of solving the above-described problems and has found that (A) a silanol group density, (B) a primary particle diameter, and (C) an association degree of the silica particles are important factors for the problems.

(1) A first embodiment of the present invention relates to a CMP polishing liquid comprising a medium and silica particles as an abrasive grain dispersed into the medium, wherein (A1) a silanol group density of the silica particles is 5.0/nm or less; (B1) a biaxial average primary particle diameter when arbitrary 20 silica particles are selected from an image obtained by scanning electron microscope observation is 25 to 55 nm; and (C1) an association degree of the silica particles is 1.1 or more.

The association degree is defined as a ratio (average particle diameter of secondary particles/biaxial average primary particle diameter) between an average particle diameter of secondary particles of the silica particles measured by a dynamic light scattering method using a grain distribution meter in a state where the silica particles are dispersed into a liquid and the biaxial average primary particle diameter.

By preparing the polishing liquid as described above, it is possible to provide the CMP polishing liquid which is excellent not only in barrier film polishing speed but also in abrasive grain dispersion stability and is capable of polishing the interlayer dielectrics at high speed.

Also, in the case where an amount of the abrasive grain to be added is relatively small as compared to the conventional example, it is possible to attain the high polishing speed for the interlayer dielectrics. This means that it is possible to suppress the added amount of the abrasive grain required for attaining the polishing speed similar to that of the conventional CMP polishing liquid. Accordingly, since it is possible to concentrate the CMP polishing liquid at a high concentration as compared to the conventional CMP polishing liquid, convenience for storage and transport is enhanced, and it is possible to provide a usage which has a higher degree of freedom and can be customized to a process of a purchaser.

(2) A second embodiment of the present invention is a CMP polishing liquid comprising a medium and silica particles as an abrasive grain dispersed into the medium, wherein (A2) the silica particles have a silanol group density of 5.0/nm or less and are not subjected to any surface treatment; (B2) a biaxial average primary particle diameter when arbitrary 20 silica particles are selected from an image obtained by scanning electron microscope observation is 60 nm or less; and (C2) an association degree of the silica particles is 1.20 or less or from 1.40 to 1.80.

By preparing the polishing liquid as described above, it is possible to provide the CMP polishing liquid which is not only excellent in barrier film polishing speed but also is capable of polishing the interlayer dielectrics at high speed and is capable of suppressing occurrence of the seam.

(3) It is preferable that the CMP polishing liquid of the present invention further contains a metal anticorrosive agent. With such configuration, it is possible to suppress etching of the conductive material and, further, to readily prevent generation of roughness on a surface after the polishing.

(4) The metal anticorrosive agent may preferably be a compound having a triazole skeleton. With such configuration, it is possible to more effectively suppress etching of the conductive material and, further, to readily prevent generation of roughness on a surface after the polishing.

(5) The metal anticorrosive agent may preferably be at least one selected from the group consisting of benzotriazole and 1H-1,2,3-triazolo[4,5-b]pyridine. It is possible to more effectively suppress the seam by using the metal anticorrosive agent in combination with the silica particles having the silanol group density of 5.0/nm² or less.

(6) The silica particles may preferably have a zeta potential in the CMP polishing liquid of 5 mV or more. With such configuration, it is possible to provide a CMP polishing liquid which is more excellent in silica particle dispersibility and interlayer dielectric polishing speed.

(7) Each silica particle may preferably be a colloidal silica from the viewpoints of easiness of changing values of the silanol group density, biaxial average primary particle diameter, association degree, and zeta potential and availability of silica particles.

(8) A content of the silica particles may preferably be 3.0 to 8.0 parts by mass relative to 100 parts by mass of the CMP polishing liquid. With such configuration, it is possible to provide a CMP polishing liquid having favorable interlayer dielectric polishing speed. Also, it is possible to more easily suppress aggregation and sedimentation of the particles, resulting in provision of a CMP polishing liquid having favorable dispersion stability and storage stability.

(9) The CMP polishing liquid of the present invention may preferably have a pH in a neutral range or an acidic range. With such configuration, it is possible to provide CMP polishing liquid which has more excellent polishing speeds for the conductive material and the barrier film.

(10) It is preferable that the CMP polishing liquid further contains an oxidized-metal dissolving agent. With such configuration, it is possible to provide a CMP polishing liquid having a favorable polishing speed for a metal such as the barrier film. Also, the conductive material is polished in the second polishing step, and it is possible to provide the CMP polishing liquid which also has a favorable polishing speed for the conductive material since the oxidized-metal dissolving agent is contained therein.

(11) It is preferable that the CMP polishing liquid of the present invention further contains an oxidizing agent. With such configuration, it is possible to provide a CMP polishing liquid which exhibits more excellent polishing speeds for the conductive material and the barrier film.

(12) The CMP polishing liquid of the present invention may preferably be stored in the form of a CMP polishing liquid concentrate having a 3-fold concentration or a higher concentration. With such configuration, it is possible to reduce costs relating to storage, transport, and the like and to perform the polishing while adjusting the concentration in use.

(13) In this case, 5 parts by mass or more of the abrasive grain may preferably be contained.

(14) Also, according to the present invention, there is provided a polishing method comprising:

a first polishing step of exposing a barrier film on a convex portion by polishing a conductive material of a substrate comprising interlayer dielectrics having a concave portion and the convex portion on a surface thereof, the barrier film coating the interlayer dielectrics along the surface, and the conductive material coating the barrier film by filling the concave portion; and a second polishing step of exposing the interlayer dielectrics of the convex portion by polishing the barrier film at least on the convex portion, wherein the polishing is performed by supplying one of the CMP polishing liquids defined in (1) to (11) at least in the second polishing step. With such polishing method, it is possible to rapidly polish the barrier film and the interlayer dielectrics.

(15) The CMP polishing liquid concentrate defined in (12) or (13) may be mixed with a diluting liquid, an additive liquid, or both of the diluting liquid and the additive liquid to prepare the CMP polishing liquid to thereby perform the polishing in the same manner as in (14).

(16) The interlayer dielectrics in the polishing method may preferably be silicon coatings or organic polymer films.

(17) The conductive material may preferably contain copper as a main component.

(18) The barrier conductive film prevents the conductive material from diffusing into the interlayer dielectrics, and the barrier conductive film may preferably contain at least one selected from the group consisting of tantalum, tantalum nitride, a tantalum alloy, other tantalum compounds, titanium, titanium nitride, a titanium alloy, other titanium compounds, ruthenium, and other ruthenium compounds.

(19) In the second polishing step, it is preferable that a part of the interlayer dielectrics on the convex portion is further polished.

According to the present invention, there is provided a semiconductor substrate or an electronic device manufactured by employing the polishing method. The semiconductor substrates and other electronic devices manufactured by the polishing method are excellent in microfabrication, thin film formation, dimension accuracy, and electric property and have high reliability.

The disclosure of the present invention relates to the subject matter of Japanese Patent Application No. 2009-190422 filed on Aug. 19, 2009, of which disclosure is incorporated herein by reference.

Effect of the Invention

According to the present invention, since it is possible to obtain a CMP polishing liquid which attains a high barrier film polishing speed, has favorable abrasive grain dispersion stability, and is capable of rapidly polishing interlayer dielectrics, it is possible to improve a throughput by a reduction in polishing step time. Also, the polishing method according to the present invention, in which chemical mechanical polishing is performed by using the CMP polishing liquid, is suitably employed for producing semiconductor substrates and other electronic devices which have high productivity, excellent microfabrication, thin film formation, dimension accuracy, and electric property, and high reliability.

Figure 1:
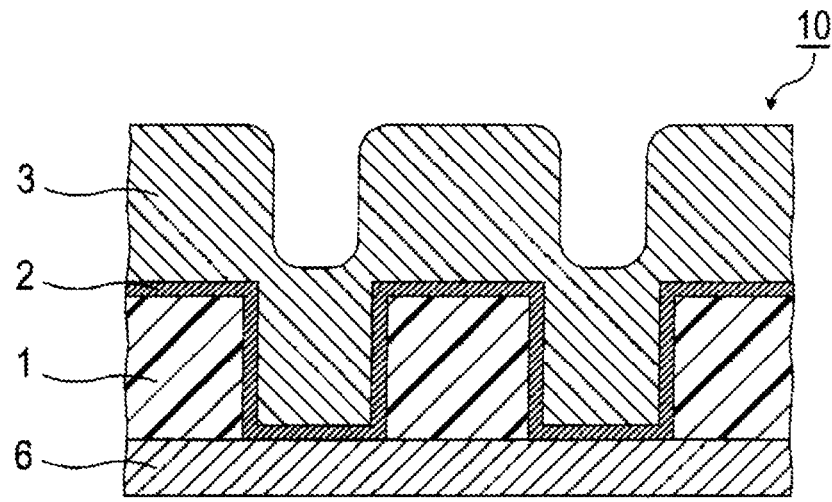
FIG. 1 is a sectional view schematically showing a flow of an ordinary damascene process, wherein shown in FIG. 1(a) is a state before polishing; shown in FIG. 1(b) is a state in which a conductive material is polished until a barrier film is exposed; and shown in FIG. 1(c) is a state in which the polishing is performed until a convex portion of interlayer dielectrics is exposed.
Figure 1:
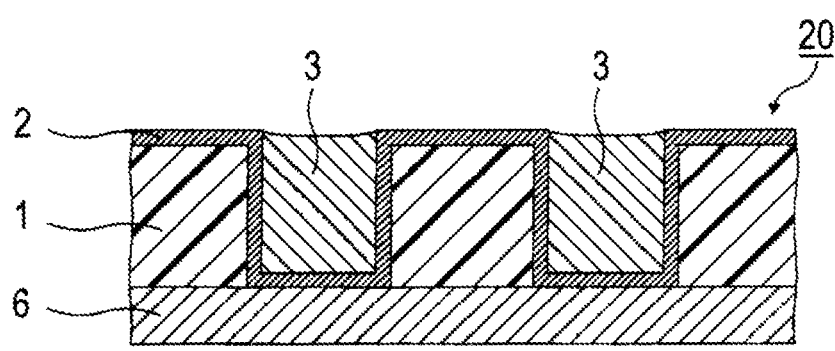
Figure 1:
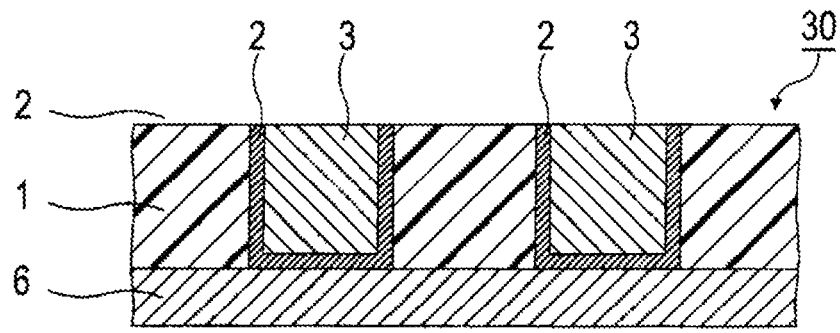

BEST MODE FOR CARRYING OUT THE INVENTION (First Embodiment)

Hereinafter, CMP polishing liquids of the present invention will be orderly described. A first embodiment of the CMP polishing liquid of the present invention is a CMP polishing liquid which contains a medium and silica particles as an abrasive grain dispersed into the medium, wherein a silanol group density of the silica particles is $5.0/nm^2$ or less; a biaxial average primary particle diameter when arbitrary 20 silica particles are selected from an image obtained by scanning electron microscope observation is 25 to 55 nm; and an association degree of the silica particles is 1.1 or more.

The CMP polishing liquid according to the first embodiment has favorable silica particle dispersion stability as compared to the conventional polishing liquid and is capable of attaining a favorable polishing speed for interlayer dielectrics. The reasons for the above-described effects have not been fully clarified, but the inventors assume as follows. Particles having a small silanol group (—Si—OH) density have a smaller number of non-reacted —Si—OH groups in the silica particles, and, accordingly, it is considered that the Si—O—Si structure in the silica particles is fully densely developed. Therefore, it is assumed that "hardness" as polishing particles becomes relatively high to increase the interlayer dielectric polishing speed. However, since it is impossible to simultaneously attain both of the polishing speed and the stability when the size of the silica particles is not within an appropriate range, it is considered that the balance among the biaxial average primary particle diameter, the association degree, and the silanol group density is important.

(I: Silica Particles)

(I-i: Silanol Group Density)

The silica particles to be used for the CMP polishing liquid according to the first embodiment have the silanol group density of $5.0/nm^2$ or less. Thus, it is possible to attain the favorable polishing speed for the interlayer dielectrics as well as to give the CMP polishing liquid having excellent dispersion stability. The silanol group density may preferably be $4.5/nm^2$ or less, more preferably $4.0/nm^2$ or less, further preferably $3.5/nm^2$ or less, particularly preferably $3.0/nm^2$ or less, considerably preferably $2.0/nm^2$ or less, from the viewpoint of the excellence in interlayer dielectric polishing speed.

In the present invention, the silanol group density ($\rho$ [number/nm$^2$]) is measured and calculated by the following titration.

[1] To start with, 15 g of silica particles is weighed and placed in a container (X [g]) of which a mass has been measured and then dispersed into an appropriate amount (100 ml or less) of water. In the case where the silica particles are in the form of a dispersion liquid in which the silica particles are dispersed into a medium such as water, the dispersion liquid is weighed and poured into the container so that an amount of the silica particles is 15 g.

[2] Next, a pH is adjusted to 3.0 to 3.5 by adding 0.1 mol/L hydrochloric acid, and a mass (Y [g]) at this stage is measured to detect a total mass of the liquid (Y−X [g]).

[3] The liquid in an amount (Y−X)/10 [g]) of 1/10 of the mass detected in [2] is weighed and poured into another container. An amount of the silica particles (A [g]) contained in the liquid at this stage is 1.5 g.

[4] 30 g of sodium chloride is added to the liquid, and ultrapure water is added until a total amount reaches to 150 g. A 0.1 mol/L sodium hydroxide solution is added to adjust a pH to 4.0 to prepare a titration sample.

[5] 0.1 mol/L sodium hydroxide was added dropwise to the titration sample until a pH reaches to 9.0, and an amount of sodium hydroxide (B [mol]) required for changing the pH from 4.0 to 9.0 is detected.

[6] A silanol group density of the silica particles is calculated by the following expression (1):

$$\rho = B \cdot N_A / A \cdot S_{BET} \quad (1)$$

(in the expression (1), $N_A$ [number/mol] represents an Avogadro number, and $S_{BET}$ [m$^2$/g] represents a BET specific surface area of silica particles).

In the case where the silica particles are available in the state of being dispersed in a medium such as water as colloidal silica which will be described later in this specification, an amount of the dispersion liquid in which 15 g of the silica particles is contained is weighed, and then the silanol group density may be measured in the same manner as described above. In the case where the silica particles are contained in the CMP polishing liquid, the silica particles may be isolated from the CMP polishing liquid and washed, and then the silanol group density is measured in the same manner as described above.

The BET specific surface area $S_{BET}$ of the silica particles is detected by the BET specific surface area measurement method. As a specific measurement method, a sample which is obtained by drying the silica particles (which can be colloidal silica) in a drier at 150° C., transferring the silica particles to a measurement cell, and deaerating in vacuum at 120° C. for 60 minutes is subjected to a one-point method or a multi-point method of causing the sample to absorb a nitrogen gas by using a BET specific surface area measurement apparatus. More specifically, the abrasive grain dried at 150° C. as described above is pulverized by using a mortar (magnetic; 100 ml) to obtain a measurement sample, and the measurement sample is placed in a measurement cell to measure a BET specific surface area V thereof by using a BET specific surface area measurement apparatus (product name: NOVE-1200) manufactured by Yuasa Ionics, Inc.

Details of the silanol group density calculation method is disclosed in, for example, Analytical Chemistry; 1956; Vol. 28; No. 12; p. 1981-1983 and Japanese Journal of Applied Physics; 2003; Vol. 42; p. 4992-4997.

(I-ii: Biaxial Average Primary Particle Diameter)

As the silica particles to be used for the CMP polishing liquid according to the first embodiment, when noting only the capability of attaining the favorable polishing speed for the interlayer dielectrics, it is preferable to use the silica particles having the biaxial average primary particle diameter within a range of 10 to 100 nm, wherein a lower limit may preferably be 20 nm or more, and an upper limit may preferably be 80 nm or less. Also, from the viewpoints of relatively favorable dispersion stability in the CMP polishing liquid and the suppressed number of polishing scratches caused by CMP, the biaxial average primary particle diameter may preferably be 20 to 60 nm, wherein a lower limit may preferably be 25 nm or more, and an upper limit may preferably be 55 nm or less. Therefore, in order to simultaneously attain the high interlayer dielectric polishing speed and the high dispersion stability of the silica particles of the CMP polishing liquid according to the first embodiment, the biaxial average primary particle diameter is set to 25 to 55 nm. From the same reasons, the biaxial average primary particle diameter may more preferably be 35 to 55 nm.

In the present invention, the biaxial average primary particle diameter (R [nm]) is calculated as described below based on the results of observation of arbitrary 20 particles by using a scanning electron microscope (SEM). More specifically, by using colloidal silica having a solid content concentration of 5 to 40 wt % dispersed into water as an example, an appropriate amount of the colloidal silica is weighed and poured into a container, and a chip 2 by 2 centimeters square obtained by cutting a wafer with wiring pattern is immersed into the liquid in the container for about 30 seconds, followed by rinsing for about 30 seconds in pure water in another container. After that, the chip is dried by blowing nitrogen, and then the chip is placed on a sample holder for SEM observation, followed by application of an accelerated voltage of 10 kV. Observation and image-capture of the silica particles are conducted at a magnification of ×100000. Arbitrary 20 particles are selected from the obtained image.

Figure 2:
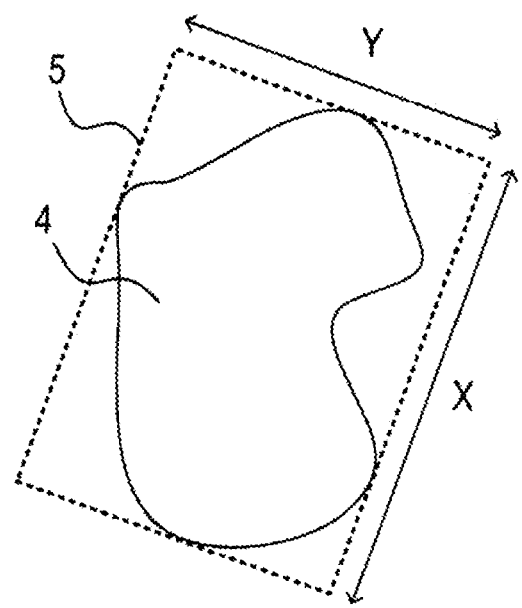
FIG. 2 is a diagram showing one example of a particle shape of which a biaxial average primary particle diameter is calculated.

For example, in the case where the selected silica particles have the form shown in FIG. 2, a rectangle (circumscribed rectangle 5) which is disposed in such a fashion that along diameter thereof is the longest while circumscribing a silica particle 4 is derived. By setting the long diameter of the circumscribed rectangle 5 as X and a short diameter thereof as Y, the biaxial average primary particle diameter of the particle is calculated from $(X+Y)/2$. An average value obtained by performing the operation for each of the 20 silica particles is called biaxial average primary particle diameter in the present invention.

(I-iii: Association Degree)

The silica particles used for the polishing liquid of the present invention has the association degree of 1.1 or more from the viewpoint of obtaining a preferred interlayer dielectric polishing speed, and, for the same reason, the association degree may preferably be 1.2 or more, more preferably 1.3 or more, further preferably 1.4 or more.

In the present invention, the association degree means a value obtained by detecting "average particle diameter" of secondary particles measured by using a particle distribution meter employing the dynamic light scattering method in a state where the abrasive grain is dispersed into a liquid and dividing the average particle diameter by the biaxial average primary particle diameter (average particle diameter/biaxial average primary particle diameter).

Here, it is possible to measure the average particle diameter by the following method. A measurement sample is adjusted by weighing an appropriate amount of the CMP polishing liquid, diluting the CMP polishing liquid with water as required so that scattered light intensity is within the range required by the dynamic light scattering mode particle size distribution meter. The measurement sample is poured into the dynamic light scattering mode particle size distribution meter, and a value obtained as D50 is detected as the average particle diameter. Examples of the particle size distribution meter of the dynamic light scattering mode having the above-described function include a light diffracting and scattering type particle size distribution meter manufactured by Coulter Electronics, Inc. (trade name: COULTER N5 TYPE). As described later in this specification, in the case of separating or concentrating the CMP polishing liquid for storage, it is possible to measure the average particle diameter of the secondary particles by adjusting the sample from a slurry containing the silica particles by employing the above-described method.

(I-iv: Zeta Potential)

As the silica particles to be used for the CMP polishing liquid of the present invention, the zeta potential of the silica particles in the CMP polishing liquid may preferably be +5 mV or more, more preferably +10 mV or more, from the viewpoints of excellence in abrasive grain dispersibility and attaining favorable polishing speed for the interlayer dielectrics. An upper limit is not particularly limited, and an upper limit of about 80 mV or less is sufficient for ordinary polishing. Examples of a method of attaining the zeta potential of 5 mV or more include a method of adjusting a pH of the CMP polishing liquid, a method of mixing a coupling agent or a water-soluble polymer with the CMP polishing liquid, and the like. As the water-soluble polymer, a water-soluble cationic polymer is suitably used.

In the present invention, the zeta potential ($\zeta$ [mV]) is measured by diluting the CMP polishing liquid with pure water so as to attain scattering intensity of the measurement sample of $1.0 \times 10^4$ to $5.0 \times 10^4$ cps in a zeta potential measurement device (cps means counts per second, which is the unit for counting the particles; same applies to the following description) and pouring the diluted CMP polishing liquid into a zeta potential measurement cell. In order to keep the scattering intensity within the above-specified range, the CMP polishing liquid is diluted so that the amount of the silica particles is 1.7 to 1.8 parts by mass, for example.

Various silica particles which are varied by the silanol group density, the biaxial average primary particle diameter, the association degree, and the zeta potential are available from some silica particle manufacturers, and it is possible to control the values based on the findings by the manufacturers.

Also, as to the type of the silica particles, conventional silica particles such as fumed silica and colloidal silica may be used, but the colloidal silica is preferred from the view point of availability of the colloidal silica having the above-specified silanol group density, biaxial average primary particle diameter, association degree, and zeta potential. In the CMP polishing liquid of the present invention, 2 or more types of abrasive grains may be used in combination insofar as the above-described characteristics are satisfied.

(I-v: Content)

A content of the silica particles may preferably be 3.0 to 8.0 parts by mass relative to 100 parts by mass of the CMP polishing liquid. Favorable polishing speed for the interlayer dielectrics tends to be attained when the content of the colloidal silica having the above-described properties is 3.0 parts by mass or more, while aggregation and sedimentation of the particles are more easily suppressed when the content is 8.0 parts by mass or less, resulting in attainment of favorable dispersion stability and storage stability. As used herein, the content is an amount to be mixed in a state of being prepared for use in the CMP polishing step (means POU: point of use) and not an amount to be mixed for the separation or concentration for storage described later in this specification.

(II: pH)

The CMP polishing liquid of the present invention is characterized by being able to polish the interlayer dielectrics at high speed, and, in order to suitably use the CMP plashing liquid as the polishing liquid for overpolishing the interlayer dielectrics during polishing of the barrier film as described above, it is preferable to keep the polishing speeds for the conductive material contained in the polished surface and the barrier film to favorable values. From such viewpoints, a pH of the CMP polishing liquid of the present invention may preferably be within a neutral range or an acidic range. The neutral range is defined as 6.5 or more and 7.5 or less, and the acidic range is defined as less than pH 6.5.

In the case of using the organic acid compound or the inorganic acid compound as the oxidized-metal dissolving agent described later in this specification, the pH may more preferably be 1.5 or more, further preferably 1.8 or more, and particularly preferably 2.0 or more, from the viewpoints of easy suppression of corrosion of the conductive material and easy suppression of the dishing caused when the conductive material is excessively polished. By keeping the pH within the above-specified range, the handling becomes easier as compared to the case of strong acidity. Also, from the viewpoints of capability of attaining the favorable polishing speeds for the conductive material and a conductor of the barrier film, the pH may more preferably be 5.0 or less, further preferably 4.5 or less, particularly preferably 4.0 or less, considerably preferably 3.5 or less, and extremely preferably 3.0 or less.

In the case of containing an amino acid as the oxidized-metal dissolving agent described later in this specification, the pH may preferably be within the neutral range.

(III: Medium)

The medium for the CMP polishing liquid is not particularly limited insofar as the silica particles are dissolved into the medium, but a medium containing water as a main component is preferred from the viewpoints of pH adjustment easiness, safety, reactivity with a polished surface, and the like. More specifically, deionized water, ion exchange water, ultrapure water, and the like are preferred.

An organic solvent may be added to the CMP polishing liquid when so required. The organic solvent may be used as a solubilizing agent for a component which is hardly soluble to water or for the purpose of improving wettability of the CMP polishing liquid on the polished surface. The organic solvent in the CMP polishing liquid of the present invention is not particularly limited, but those which can be mixed with water are preferred, and the organic solvents may be used alone or in combination of two or more thereof.

Examples of the organic solvent to be used as the solubilizing agent include a polar solvent such as an alcohol and acetic acid. Also, for the purposes of improving the wettability on the polished surface and approximating the polishing speeds for the interlayer dielectrics and the barrier film, examples of the organic solvent include glycol, glycol monoether, glycol diether, alcohol, ester carbonate, lactone, ether, ketone, phenol, dimethylformamide, n-methylpyrrolidone, ethyl acetate, ethyl lactate, and sulfolane. Among the above, at least one selected from the group consisting of glycol monoether, alcohol, and ester carbonate is preferred.

In the case of adding the organic solvent, a content of the organic solvent may preferably be 0.1 to 95 parts by mass relative to 100 parts by mass of the CMP polishing liquid. The content may more preferably be 0.2 part by mass or more, further preferably 0.5 part by mass or more, from the viewpoint of improving the wettability of the CMP polishing liquid on the substrate. An upper limit may preferably be 50 parts by mass or less, further preferably 10 parts by mass, from the viewpoint of preventing difficulty in terms of production process.

A content of water may be the balance and is not particularly limited insofar as water is contained. Also, water may be used as a diluting liquid for diluting the CMP polishing liquid which is concentrated for storage as described later in this specification to a concentration suitable for use.

(IV: Other Components)

In the present invention, the predominant object is to attain the polishing speeds for the conductive material and the barrier film, and, further, the oxidized-metal dissolving agent and the metal-oxidizing agent (hereinafter sometimes referred to as oxidizing agent). Since the conductive material can be etched in the case where the pH of the CMP polishing liquid is low, the metal anticorrosive agent may be contained for the purpose of suppressing the etching. Hereinafter, these components will be described.

(IV-i: Oxidized-Metal Dissolving Agent)

The CMP polishing liquid of the present invention may preferably contain an oxidized-metal dissolving agent from the viewpoint of attaining favorable polishing speeds for the metals such as the conductive material and the barrier film. As used herein, the oxidized-metal dissolving agent is defined as a substance which contributes to dissolving the oxidized conductive material into water and includes those known as a chelating agent and an etching agent.

The oxidized-metal dissolving agent is used for the purpose of contributing to the pH adjustment and the dissolution of the conductive material and is not particularly limited insofar as the oxidized-metal dissolving agent has these functions. Specific examples of the oxidized-metal dissolving agent include an organic acid compound such as organic acid, organic acid ester, and a salt of organic acid; an inorganic acid compound such as inorganic acid and a salt of inorganic acid; and amino acid. The salt may preferably be, but is not particularly limited to, an ammonium salt. These oxidized-metal dissolving agents may be used alone or in combination of two or more thereof, and the organic aid, the inorganic acid, and the amino acid may be used in combination.

The oxidized-metal dissolving agent may preferably contain the organic acid compound, more preferably contain the organic acid, from the viewpoints of maintaining the practical CMP speed and effectively suppressing the etching speed. Examples of the organic acid include an organic acid such as formic acid, acetic acid, glyoxylic acid, pyruvic acid, lactic acid, mandelic acid, vinyl acetic acid, 3-hydroxy butyric acid, oxalic acid, maleic acid, malonic acid, methylmalonic acid, dimethylmalonic acid, phthalic acid, tartaric acid, fumaric acid, malic acid, succinic acid, glutaric acid, oxaloacetic acid, citric acid, hemimellitic acid, trimellitic acid, trimesic acid, mellitic acid, isocitric acid, aconitic acid, oxalosuccinic acid, propionic acid, butyric acid, isobutyric acid, valeric acid, isovaleric acid, pivalic acid, caproic acid, octanoic acid, adipic acid, pimelic acid, suberic acid, azelaic acid, sebacic acid, acrylic acid, propiolic acid, methacrylic acid, crotonic acid, isocrotonic acid, benzoic acid, cinnamic acid, isophthalic acid, terephthalic acid, furancarboxylic acid, thiophene carboxylic acid, nicotinic acid, isonicotinic acid, glycolic acid, salicylic acid, creosote acid, vanillic acid, syringic acid, pyrocatechuic acid, resorcylic acid, gentisic acid, procatechuic acid, orsellinic acid, gallic acid, tartronic acid, leucine acid, mevalonic acid, pantoic acid, ricinoleic acid, ricinelaidic acid, cerebronic acid, citramalate, quinic acid, shikimic acid, mandelic acid, benzylic acid, atrolactic acid, melilotic acid, phloretic acid, coumaric acid, umbellic acid, caffeic acid, ferulic acid, isoferulic acid, and sinapic acid; and acid anhydride of organic acid such as maleic anhydride, propionic anhydride, succinic anhydride, and phthalic anhydride. Among the above, it is preferable to contain at least one selected from the group consisting of formic acid, malonic acid, malic acid, tartaric acid, citric acid, salicylic acid, and adipic acid. These organic acids may be used alone or in combination of two or more thereof.

Examples of the oxidized-metal dissolving agent include an inorganic acid from the viewpoint of easily obtaining a high polishing speed for the conductive material. Specific examples of the inorganic acid include monovalent inorganic acid such as hydrochloric acid and nitric acid; divalent acid such as sulfuric acid, chromic acid, carbonic acid, molybdic acid, hydrogen sulfide, sulfurous acid, thiosulfuric acid, selenic acid, telluric acid, tellurous acid, tungstic acid, and phosphonic acid; trivalent acid such as phosphoric acid, phosphomolybdic acid, phosphotungstic acid, and vanadic acid; and tetravalent acid and acid having larger valence such as silicomolybdic acid, silicotungstic acid, pyrophosphoric acid, and tripolyphosphoric acid. In the case of using the inorganic acid, the inorganic acid may preferably be nitric acid. These inorganic acids may be used alone or in combination of two or more thereof.

As the oxidized-metal dissolving agent, an amino acid may be contained from the viewpoints of easy pH adjustment and attaining high conductive material polishing speed. The amino acid is not particularly limited insofar as the amino acid is dissolved into water, and specific examples thereof include glycine, alanine, valin, leucine, isoleucine, serine, threonine, cysteine, cysitine, methionine, asparaginic acid, glutamic acid, lysine, arginine, phenylalanine, tyrosine, histidine, tryptophan, proline, and oxiproline. These amino acids may be used alone or in combination of tow or more.

In the case of adding the oxidized-metal dissolving agent, a content thereof may preferably be 0.001 to 20 parts by mass relative to 100 parts by mass of the CMP polishing liquid. The content may more preferably be 0.002 part by mass or more, further preferably 0.005 part by mass or more, from the viewpoint of easily attaining favorable polishing speeds for the metals such as the conductive material and the barrier film. An upper limit may more preferably be 15 parts by mass or less, further preferably 10 parts by mass or less, particularly preferably 3 parts by mass or less, from the viewpoints of suppressing etching and easily preventing the roughening on the polished surface.

(IV-ii: Metal Anticorrosive Agent)

The CMP polishing liquid of the present invention may preferably contain a metal corrosion protection agent having functions of forming a protective film for protecting the conductive material, suppressing the etching of the conductive material, and preventing the roughening on the surface after the polishing. As used herein, the metal anticorrosive agent is defined as a substance which is capable of forming a protective film on the conductive material when used alone. It is possible to determine whether or not the protective film is formed by dipping a sample having the conductive material film into a solution of the metal corrosion protection agent and conducting a composition analysis of a surface of the sample. The protective film formed from the metal anticorrosive agent is not necessarily formed in the CMP polishing liquid of the present invention.

Specific examples of the metal anticorrosive agent include a triazole compound having a triazole skeleton in molecule, a pyrazole compound having a pyrazole skeleton in molecule, a pyrimidine compound having a pyrimidine skeleton in molecule, an imidazole compound having an imidazole skeleton in molecule, a guanidine compound having a guanidine skeleton in molecule, a thiazole compound having a thiazole compound in molecule, and a tetrazole compound having a tetrazole compound in molecule. These metal anticorrosive agents may be used alone or in combination of two or more thereof.

Among the above, the triazole compound is preferred, and specific examples thereof include a triazole derivative such as 1,2,3-triazole, 1,2,4-triazole, 3-amino-1H-1,2,4-triazole; benzotriazole; a benzotriazole derivative such as 1-hydroxybenzotriazole, 1-dihydroxypropyl benzotriazole, 2,3-dicarboxypropyl benzotriazole, 4-hydroxybenzotriazole, 4-carboxyl(-1H-)benzotriazole, 4-carboxyl(-1H-)benzotriazole methylester, 4-carboxyl(-1H-)benzotriazole butylester, 4-carboxyl(-1H-)benzotriazole octylester, 5-hexylbenzotriazole, [1,2,3-benzotriazolyl-1-methyl][1,2,4-triazolyl-1-methyl][2-e thylhexyl]amine, tolyltriazole, naphthotriazole, bis[(1-benzotriazolyl)methyl]phosphonate, and 3-aminobenzotriazole; and a triazole derivative having a pyridine skeleton such as 1-acetyl-1H-1,2,3-triazolo[4,5-b]pyridine, 1H-1,2,3-triazolo[4,5-b]pyridine, and 3H-1,2,3-triazolo[4,5-b]pyridine-3-ole.

A content of the metal anticorrosive agent may preferably be 0.001 part by mass or more, further preferably 0.01 part by mass or more, relative to 100 parts by mass of the CMP polishing liquid, from the viewpoints of suppressing the etching of the conductive material and preventing the roughening of the surface after polishing. Also, an upper limit may preferably be 10 parts by mass or less, more preferably 5 parts by mass or less, further preferably 3 parts by mass or less, particularly preferably 2 parts by mass or less, from the viewpoint of keeping the polishing speeds for the conductive material film and the barrier film to practical polishing speeds.

(IV-iii: Metal-oxidizing Agent)

The CMP polishing liquid of the present invention may preferably contain a metal-oxidizing agent having the capability of oxidizing the conductive material. Specific examples of the metal-oxidizing agent include hydrogen peroxide, nitric acid, potassium periodate, hypochlorous acid, and ozone water, among which hydrogen peroxide is more preferred. These metal-oxidizing agents may be used alone or in combination of two or more thereof. Since hydrogen peroxide is ordinarily available as hydrogen peroxide water, it is possible to use the hydrogen peroxide water as a diluting liquid in the case of using the CMP polishing liquid of the present invention which is concentrated for storage as described later in this specification.

In the case where the substrate is a silicon substrate including an integrated circuit element, since contamination with an alkali metal, alkali earth metal, halide, or the like is undesirable, an oxidizing agent which does not contain any nonvolatile component is desired. However, since temporal change in composition of the ozone water is great, hydrogen peroxide is most suitable. In the case where the substrate for which the oxidizing agent is used is a glass substrate which does not include any semiconductor element, the oxidizing agent containing nonvolatile component may be used without any trouble.

A content of the metal-oxidizing agent may preferably be 0.01 to 50 parts by mass relative to 100 parts by mass of the CMP polishing liquid. The content may preferably be 0.02 part by mass or more, further preferably 0.05 part by mass or more, from the viewpoint of preventing a reduction in CMP speed due to insufficient oxidization of the metal. Further, an upper limit may more preferably be 30 parts by mass or less, further preferably 10 parts by mass or less, from the viewpoint of preventing the roughening on the surface to be polished. In the case of using hydrogen peroxide as the oxidizing agent, the hydrogen peroxide water is added after converting the hydrogen peroxide water so that the hydrogen peroxide is ultimately within the above-specified range.

In the case of setting the pH of the CMP polishing liquid to the acidic range, the content of the oxidizing agent may more preferably be within a range of 0.01 to 3 parts by mass relative to 100 parts by mass of the CMP polishing liquid from the viewpoint of attaining the favorable barrier film polishing speed. In the case where the pH of the CMP polishing liquid is 1 to 4, the barrier film polishing speed tends to be the highest when the oxidizing agent content is about 0.15 part by mass. Therefore, the oxidizing agent content may further preferably be 2.5 parts by mass or less, further preferably 2 parts by mass or less, particularly preferably 1.5 parts by mass or less, considerably preferably 1.0 part by mass or less, relative to 100 parts by mass of the CMP polishing liquid.

(IV-iv: Water-Soluble Polymer)

The CMP polishing liquid of the present invention may contain a water-soluble polymer. The CMP polishing liquid containing the water-soluble polymer is capable of attaining excellent polished surface flattening and suppressing erosion at a portion where microwirings are densely formed.

A weight average molecular weight of the water-soluble polymer may preferably be 500 or more, more preferably 1500 or more, further preferably 5000 or more, from the viewpoint of realizing the high polishing speed. Also, an upper limit may preferably be, but is not particularly limited to, 5000000 or less from the viewpoint of solubility to the CMP polishing liquid. It is possible to measure the weight average molecular weight of the water-soluble polymer by gel permeation chromatography under the following conditions by using a standard curve of standard polystyrene.
(Conditions)
Sample: 10 μL
Standard polystyrene: Standard polystyrene manufactured by Tosoh Corporation (molecular weight: 190000, 17900, 9100, 2980, 578, 474, 370, 266).
Detector: RI-Monitor manufactured by Hitachi, Ltd. (trade name: L-3000).
Integrator: GPC integrator manufactured by Hitachi, Ltd. (trade name: D-2200).
Pump: L-6000 (trade name) manufactured by Hitachi, Ltd.
Degassing device: Shodex DEGAS (trade name) manufactured by Showa Denko K. K.
Column: GL-R440, GL-R430, and GL-R420 (trade names) manufactured by Hitachi Chemical Co., Ltd., which were connected in this order in use.
Eluent: Tetrahydrofuran (THF).
Measurement temperature: 23° C.
Flow rate: 1.75 mL/min.
Measurement time: 45 minutes.

The water-soluble polymer may preferably be, but is not particularly limited to, an acrylate polymer (a polymer obtainable by polymerizing or copolymerizing a raw material monomer containing a C=C—COOH skeleton as a monomer component) from the viewpoint of excellent flattening property.

Specific examples of the raw material monomer for obtaining the acrylate polymer include a carboxylic acid such as acrylic acid, methacrylic acid, crotonic acid, vinyl acetic acid, tiglic acid, 2-trifluoromethyl acrylic acid, itaconic acid, fumaric acid, maleic acid, citraconic acid, mesaconic acid, and a gluconic acid; sulfonic acid such as 2-acrylamido-2-methylpropanesulfonic acid; ester such as methyl acrylate, butyl acrylate, methyl methacrylate, and butyl methacrylate; and a salt such as an ammonium salt, an alkali metal salt, and an alkylamine salt of each of the above monomers.

Among the above, it is preferable to contain the methacrylate polymer (a polymer obtainable by polymerizing or copolymerizing a raw material monomer containing methacrylic acid as a monomer component). The methacrylate polymer may preferably be at least one selected from the group consisting of a homopolymer of methacrylic acid and a copolymer of methacrylic acid and a monomer which is capable of copolymerization with the methacrylic acid.

In the case where the methacrylate polymer is the copolymer of methacrylic acid and a monomer which is capable of copolymerization with the methacrylic acid, a proportion of the methacrylic acid to a total monomer amount may preferably be 40 mol % or more and less than 100 mol %, more preferably 70 mol % or more and less than 100 mol %. It is possible to suppress the erosion and the seam as well as to further improve the flatness of the polished surface when the proportion of the methacrylic acid is increased. When the proportion of the methacrylic acid is less than 40 mol %, it is difficult to effectively suppress the erosion and the seam, and the flatness of the polished surface tends to be deteriorated.

An amount of the methacrylate polymer to be added may preferably be 1 part by mass or less, more preferably 0.5 part by mass or less, further preferably 0.1 part by mass or less, particularly preferably 0.05 part by mass or less, relative to 100 parts by mass of a total amount of the entire components of the CMP polishing liquid, from the viewpoint of capability of improving flatness while suppressing sharp deterioration of stability of the abrasive grain contained in the CMP polishing liquid. A lower limit may preferably be 0.001 part by mass or more, more preferably 0.05 part by mass or more, further preferably 0.01 part by mass or more, relative to 100 parts by mass of the total amount of the entire components of the CMP polishing liquid, from the viewpoint of effectively improving the flatness.

(Second Embodiment)

A second embodiment of the CMP polishing liquid of the present invention is a CMP polishing liquid containing a medium and silica particles as an abrasive grain dispersed into the medium, wherein the silica particles have the silanol group density of 5.0/nm or less; the silica particles are not subjected to any surface treatment; the biaxial average primary particle diameter of the silica particles is 60 nm or less; and the association degree of the silica particles is 1.20 or less or between 1.40 and 1.80.

The CMP polishing liquid according to the second embodiment is capable of effectively suppressing occurrence of the seam which is the phenomenon that a thickness of interlayer dielectrics in the vicinity of the wiring metal part is decreased while attaining favorable polishing speeds for a barrier layer and the interlayer dielectrics. The reason for the achievement of the effect has not been fully clarified, but the inventors assume as follows.

As a mechanism for the occurrence of the seam, it is assumed that a reaction layer formed by a reaction between the conductive material and the components contained in the CMP polishing liquid attracts the abrasive grain by electrostatic interaction, and, as a result, the abrasive grain contained in the CMP polishing liquid is highly concentrated on a surface boundary between the wiring metal part of the conductive material 3 and the interlayer dielectrics 1. As a result, the boundary surface in which the excessive abrasive grain is present is excessively polished to cause the seam. Examples of the compound forming the reaction layer include, but are not limited to, the conductive material, oxidized-metal dissolving agent, metal anticorrosive agent, and water-soluble polymer.

As described above, the silica particles ordinarily have a silanol group (—Si—OH group) on a terminal (surface) thereof. Since the hydrogen atom in the silanol group is hardly disassociated in the acidic range and the neutral range, the zeta potential of ordinary silica particles is slightly positive or close to zero. However, by keeping the silanol group number within the small range of $5.0/nm^2$ or less, it is possible to impart a zeta potential which is a large positive value (e.g. 5 mV or more) in the acidic range.

In general, a barrier layer is formed for the purpose of preventing diffusion of the conductive material into the interlayer dielectrics and improving adhesion between the interlayer dielectrics and the conductive material. Since the barrier layer is positively charged in the CMP polishing liquid, an abrasive grain concentration on a boundary surface of the interlayer dielectrics near the wiring metal part is reduced due to electrostatic repulsion of the positively charged silica particles. Further, since the silica particles have the positive and large zeta potential, the abrasive grain particles repel with each other to be satisfactorily dispersed into the CMP polishing liquid, thereby suppressing aggregation of the silica particles at a specific position. It is assumed that the seam is suppressed by the synergy effect of the above-described effects. A lower limit of the silanol group density may preferably be, but is not particularly limited to, $1.5/nm^2$ or more from the viewpoint of easy availability.

The zeta potential of the abrasive grain may preferably be 5 mV or more, preferably 7 mV or more, further preferably 10 mV or more, from the viewpoint of more effective seam suppression.

Since it is considered that the seam suppression effect is caused by the electrostatic synergy between the interlayer dielectrics or the barrier layer and the abrasive grain, the above-described action and effect can be lost when the polished surface is subjected to a surface treatment even when the silanol group density is within the above-specified range. Therefore, in the CMP polishing liquid of the second embodiment, the abrasive grain to be used is not subjected to any surface treatment. Also, it is considered that the interlayer dielectric polishing speed and the abrasive grain dispersion stability tend to be unsatisfactory due to the surface treatment.

As used herein, the surface treatment is a treatment of obtaining positively charged colloidal silica by modifying colloidal silica surfaces with an amino group-containing silane coupling agent. However, it is difficult to attain the satisfactory interlayer dielectric polishing speed with the use of the surface-treated colloidal silica.

On the other hand, the mechanism for the polishing of the interlayer dielectrics is considered to be the same as that described in the first embodiment. More specifically, the interlayer dielectrics are polished by the mechanical polishing action which is a physical contact between the interlayer dielectrics and the silica particles. The silica particles having low silanol density contain less non-reacted —Si—OH groups existing in the particles, and, therefore, a Si—O—Si structure in the silica particles is satisfactorily densely developed. Therefore, it is assumed that the interlayer dielectric polishing speed is increased since "hardness" as polishing particles is relatively increased. In contrast, the silanol groups in the surface-treated silica particles are modified by an amino group-containing silane coupling agent or the like to be positively-charged silica particles which are bulky. It is considered that satisfactory interlayer dielectric polishing speed is not attained since the obtained colloidal silica has a low density and relatively low "hardness" of the particles.

In the CMP polishing liquid according to the second embodiment, the biaxial average primary particle diameter is 60 nm or less in order to simultaneously attain the interlayer dielectric polishing speed and the seam suppression effect. The biaxial average primary particle diameter is more preferably 50 nm or less because of the same reason as described above. It is assumed that, when the biaxial average primary particle diameter is large, the number of particles per unit volume is reduced to reduce a physical contact with the interlayer dielectrics, thereby making it difficult to attain a satisfactory silicon dioxide polishing amount.

Also, in the CMP polishing liquid according to the second embodiment, the abrasive grain having the association degree of 1.20 or less or between 1.40 and 1.80 is used. When the association degree is 1.20 or less, each of the abrasive grain particles exists as one grain particle. In other words, a state of the grain particle is close to a sphere. In contrast, when the association degree is between 1.40 and 1.80, two abrasive grains are combined (not aggregated) to form a "peanut shell-like" shape. It is assumed that the favorable interlayer dielectric polishing speed is attained since satisfactory physical contact with the interlayer dielectrics is easily attained by the shape of the grains.

Other features and preferred modes of the CMP polishing liquid according to the second embodiments are approximately the same as those of the CMP polishing liquid of the first embodiment. However, it is preferable to use the compound having the triazole skeleton as the metal anticorrosive agent from the viewpoint of the capability of effectively suppressing the seam by the synergy with the abrasive grain, and, among others, the metal anticorrosive agent may particularly preferably be at least one selected from the group consisting of benzotriazole and 1H-1,2,3,triazolo[4,5-b]pyridine.

The reason why benzotriazole and 1H-1,2,3,triazolo[4,5-b]pyridine among various metal anticorrosive agents are particularly excellent in seam suppression has not been fully clarified, but it is assumed that mechanical contact of the abrasive grain with the boundary surfaces between the conductive material and the interlayer dielectrics is suppressed due to the protective film which is firmly formed on the conductive material by the action of the anti-corrosion agent.

The CMP polishing liquid of the present invention has the high interlayer dielectric polishing speed as described above, and it is possible to obtain various types of CMP polishing liquids by changing amounts of components to be added other than the abrasive grain, such as the oxidized-metal dissolving agent. Therefore, the CMP polishing liquid has the great characteristics of having the wide margin as a CMP polishing liquid material. More specifically, in the conventional examples, when a type or a content of one of components of the CMP polishing liquid is changed for improving one of the properties, there is a tendency that the delicate balance between the components is disrupted to deteriorate one of other properties. For example, when a type of a component is changed for improving flatness of a surface after polishing, the polishing speed which is the most important factor can be reduced.

However, since the effect of enhancing the polishing performance (particularly the polishing speed) is improved by the silica particles in the CMP polishing liquid of the present invention, it is easy to adjust various properties (e.g. property other than the polishing speed) by using one of other components. For example, by changing the type and the amount of one of the components described under the (IV: Other Components), it is possible to obtain various types of CMP polishing liquids. This means that the interlayer dielectric polishing speed is not influenced by a change in polishing speed for the conductive material or barrier metal based on the conventional findings. Therefore, by changing other components based on the known findings, obtainment of a so-called highly selective CMP polishing liquid of which the barrier metal polishing speed is higher than the interlayer dielectric polishing speed or, in contrast, a non-selective CMP polishing liquid of which polishing speeds for the barrier metal and the interlayer dielectrics are similar to each other is facilitated.

Further, according to the CMP polishing liquid of the present invention, since it is possible to attain the relatively high interlayer dielectric polishing speed by the relatively low amount of the abrasive grain to be added, the CMP polishing liquid is advantageous from the cost point of view. Of course, it is possible to add the abrasive grain to a degree which is free from influences of aggregation, sedimentation, and the like. However, since the small amount of the abrasive grain is sufficient in the CMP polishing liquid of the present invention, it is possible to concentrate the CMP polishing liquid to a high concentration for transport or storage thereof. In short, "slurry" at least containing the silica particles and one or a plurality of "additive liquids" or "diluting agents" containing a component other than the silica particles are separately prepared to be stored, and they are mixed to be used for the CMP polishing step.

(Storage as Separated Liquids)

It is possible to adjust the polishing speed to the preferred value by containing the component such as the oxidized-metal dissolving agent or the like as described above, but the dispersion stability of the silica particles can be deteriorated by the preliminary mixing. In order to avoid the dispersion stability deterioration, it is possible to separately prepare a slurry at least containing the silica particles from an additive liquid containing a component other than the silica particles (e.g. component which can deteriorate the dispersion stability of the silica particles) of the CMP polishing liquid of the present invention and to store them separately.

For example, in the case where the CMP polishing liquid contains the silica particles, oxidized-metal dissolving agent, metal-oxidizing agent, metal anticorrosive agent, and water, it is possible to separately store the metal-oxidizing agent which can influence on the dispersion stability of the silica particles from the silica particles. In short, it is possible to separate the CMP polishing liquid into a solution containing the metal-oxidizing agent and a slurry containing the silica particles, oxidized-metal dissolving agent, metal anticorrosive agent, and water.

(Storage as Concentrate)

Since the primary particle diameter, association degree, and silanol group density of the silica particles to be used for the CMP polishing liquid of the present invention are within the above-described range, it is possible to attain the relatively high interlayer dielectric polishing speed with the relatively small amount of the abrasive grain, and, therefore, the silica particles can be contained in and dispersed into the medium at a high concentration. An upper limit of content of the conventional silica particles is about 10 parts by mass relative to 100 parts by mass of the medium even when the dispersibility is improved by the conventional method, and aggregation and sedimentation occur when the content exceeds the upper limit. However, 10 parts by mass or more of the silica particles to be used for the CMP polishing liquid of the present invention can be dispersed into the medium, and about 12 parts by mass or less of the silica particles can easily be contained in and dispersed into the medium. Also, about 18 parts by mass of the silica particles can be contained in and dispersed into the medium at the maximum. This indicates that the CMP polishing liquid of the present invention can be stored and transported as a CMP polishing liquid concentrate in which the CMP polishing liquid is highly concentrated, which is considerably advantageous in terms of process. For example, in the case of using the CMP polishing liquid containing 5 parts by mass of the silica particles, it is possible to concentrate the CMP polishing liquid to a 3-fold concentration for storage and transport. Thus, it is possible to store and transport the CMP polishing liquid concentrate of which the concentration is 3-fold or more of the CMP polishing liquid in use. Of source, it is possible to concentrate the slurry in the same manner in the above-described storage as separated liquid to be stored and transported as "concentrated slurry".

More specifically, a CMP polishing liquid concentrate at least containing 10 parts by mass or more of the above-described silica particles relative to 100 parts by mass of the CMP polishing liquid concentrate, an additive liquid containing the components other than the silica particles, and a diluting liquid are separately prepared, and these liquids are mixed just before the polishing step or supplied while adjusting the flow rates thereof to attain a desired concentration for polishing, thereby obtaining the CMP polishing liquid. Examples of the diluting liquid include water, an organic solvent, and a mixture solvent of water and organic solvent. Also, the diluting liquid may contain the components other than the silica particles, and, for example, it is possible to separately prepare the CMP polishing liquid concentrate, hydrogen peroxide water as a diluting liquid containing the metal-oxidizing agent, and an additive liquid containing the rest of the components. In the case where the dispersion stability is not deteriorated at all when the separation into the additive liquid and the diluting liquid is not conducted, either one of them is used.

(V: Usage and Method of Use)

It is possible to use the above-described CMP polishing liquid of the present invention for a polishing step for production of semiconductor substrates and electronic devices. More specifically, it is possible to use the CMP polishing liquid for formation of wirings on a semiconductor substrate.

For example, it is possible to use the CMP polishing liquid for CMP of a conductive material, a barrier film and interlayer dielectrics.

As one of specific polishing methods using the CMP polishing liquid of the present invention, the polishing method comprises:

a first polishing step of exposing a barrier film exposing a barrier film on a convex portion by polishing a conductive material of a substrate comprising interlayer dielectrics having a concave portion and the convex portion on the surface thereof, the barrier film coating the interlayer dielectrics along the surface, and the conductive material coating the barrier film by filling the concave portion; and a second polishing step of exposing the interlayer dielectrics of the convex portion by polishing the barrier film at least on the convex portion. In the second polishing step, so-called overpolishing, in which a part of the convex portion of the interlayer dielectrics is polished to be flattened, may be performed.

Examples of polishing methods in the case of preparing the CMP polishing liquid of the present invention in the concentrated state to be stored as the CMP polishing liquid concentrate include a polishing method characterized by comprising:

a first polishing step of exposing a barrier film exposing a barrier film on a convex portion by polishing a conductive material of a substrate comprising interlayer dielectrics having a concave portion and the convex portion on the surface thereof, the barrier film coating the interlayer dielectrics along the surface, and the conductive material coating the barrier film by filling the concave portion;

a mixing step of preparing the CMP polishing liquid by mixing the CMP polishing liquid concentrate with a diluting liquid, an additive liquid, or both of the diluting liquid and the additive liquid; and a second polishing step of exposing the interlayer dielectrics of the convex portion by polishing the barrier film at least on the convex portion. In this case, the mixing step may be such a method that the CMP polishing liquid concentrate, the diluting liquid, the additive liquid, and the like are supplied through separate pipings before the second polishing step is started so that the CMP polishing liquid concentrate, the diluting liquid, the additive liquid, and the like are mixed in a system of the second polishing step. Also, as the mixing step, a method of preparing the CMP polishing liquid before the second polishing step by mixing the CMP polishing liquid concentrate, the diluting liquid, the additive liquid, and the like may be employed.

Examples of the conductive material include a copper metal such as copper, a copper alloy, an oxide of copper, and an oxide of a copper alloy; a tungsten metal such as tungsten, tungsten nitride, and a tungsten alloy; and a substance mainly containing silver or gold, among which the metal containing the copper metal as a main component is preferred, and the metal containing copper as a main component is more preferred. The conductive material may be formed into a film by known sputtering, plating, or the like.

Examples of the interlayer dielectrics include a silicon coating, and an organic polymer film.

Examples of the silicon coating include silicon dioxide, a fluorosilicate glass, an organosilicate glass obtainable by using as a starting material trimethylsilane or dimethoxydimethylsilane, siliconoxynitride, silica coating such as hydrogen silsesquioxane, silicon carbide, and silicon nitride.

Examples of the organic polymer film include an organosilicate glass using trimethylsilane as a starting material, and a Low-k film (low dielectric film) such as an all-aromatic Low-k film (all-aromatic low dielectric interlayer insulating film), among which the organosilicate glass is preferred. The film can be formed by CVD, spin coating, dip coating, or spray coating. The surface is processed to form a convex portion and a concave portion.

The barrier film is formed for the purpose of preventing diffusion of the conductive material into the interlayer dielectrics and improving adhesion between the interlayer dielectrics and the conductive material. Examples of the barrier film include a titanium metal such as titanium, titanium nitride, and a titanium alloy; a tantalum metal such as tantalum, tantalum nitride, and a tantalum alloy; and a ruthenium metal such as ruthenium and a ruthenium alloy, and these may be used alone or in combination of two or more thereof. Also, the barrier film may be a laminate film including two or more layers.

As a polishing apparatus in the case of polishing by using a polishing pad, for example, an ordinary polishing apparatus including a holder capable of holding a substrate to be polished and a platen to which the polishing pad is attached, which is connected to a motor or the like of which the number of rotations is changeable is usable. As the polishing pad, an ordinary nonwoven fabric, foamed polyurethane, porous fluorine resin, or the like may be used without particular limitation.

Polishing conditions are not particularly limited, but a slow rotation speed of the platen such as 200 $min^{-1}$ or less is preferred so that the substrate does not jump out. A polishing pressure may preferably be 1 to 100 kPa, more preferably 5 to 50 kPa in order to satisfy suppression of fluctuation in CMP speed in one substrate (in-plane CMP speed uniformity) and flatness attained by elimination of unevenness which were present before the polishing (pattern flatness).

During the polishing, the CMP polishing liquid is continuously supplied to the polishing pad by using a pump or the like. A supply amount is not limited, but it is preferable that a surface of the polishing pad is always covered with the CMP polishing liquid. The substrate after the completion of polishing may preferably be subjected to washing well with running water, removal of water droplets adhered to the substrate by spin-drying or the like, and drying. It is preferable to add the substrate washing step after the polishing step according to the present invention.

Figure 3:
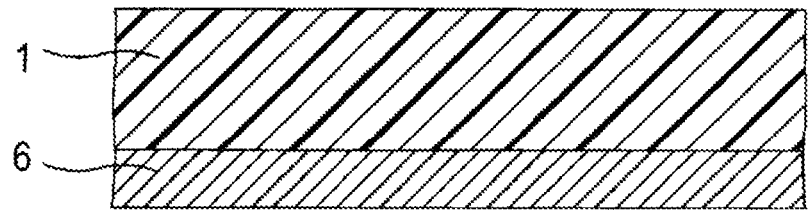
FIG. 3(a) to FIG. 3(d) are sectional views each schematically showing one example of a step of forming a wiring film in a semiconductor substrate.
Figure 3:
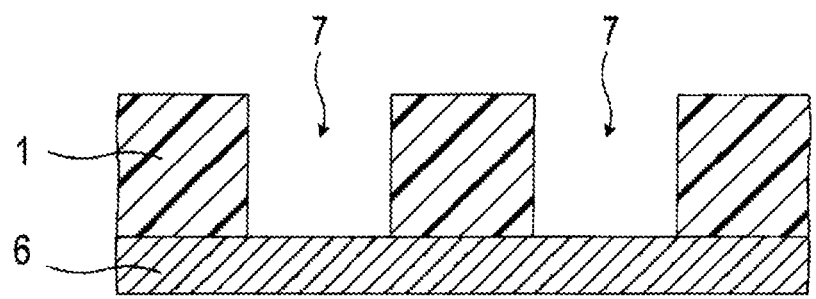
Figure 3:
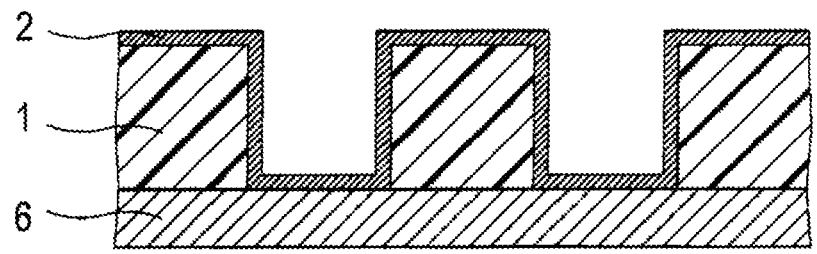
Figure 3:
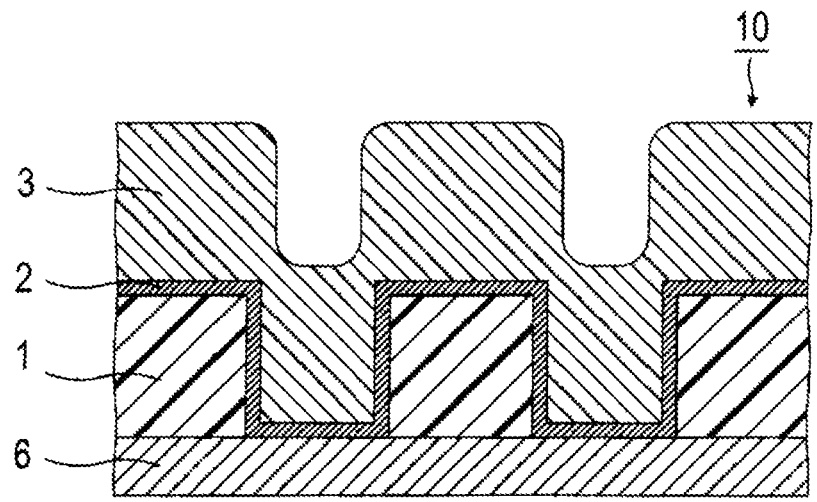

Hereinafter, modes of embodiments of the polishing methods of the present invention will be described in more details by using specific examples of a wiring layer formation step on a semiconductor substrate shown in FIG. 3. Of course, the polishing methods of the present invention are not limited to the following modes of embodiments.

As shown in FIG. 3(a), interlayer dielectrics 1 of silicon dioxide or the like are laminated on a silicon substrate 6. Next, a surface of the interlayer dielectrics is processed by employing known means such as resist layer formation, etching, and the like to form concave portions 7 (substrate exposed portions) in a predetermined pattern. Thus, a surface having convex portions and concave portions shown in FIG. 3(b) is formed. Next, as shown in FIG. 3(c), a barrier film 2 of tantalum or the like covering the interlayer dielectrics is formed along the convex and concave portions on the surface by vapor deposition, CVD, or the like.

Further, as shown in FIG. 3(d), a conductive material 3 made from a wiring metal such as copper is formed by vapor deposition, plating, CVD, or the like in such a manner as to fill the concave portions to form a substrate 10 which is to be subjected to the polishing method of the present invention. Thicknesses of the interlayer dielectrics 1, the barrier film 2, and the conductive material 3 are preferably about 10 to 2000 nm, about 1 to 100 nm, and about 10 to 2500 nm, respectively.

Hereinafter, a method of polishing the substrate 10 formed by the above-described method by using the CMP polishing liquid of the present invention will be described with reference to FIG. 1. The conductive material 3 on a surface of the substrate 10 of FIG. 1(a) is polished by CMP using the first CMP polishing liquid of which a conductive material/barrier film polishing speed ratio is satisfactorily large (first polishing step). Thus, a substrate 20 having a desired conductor pattern, in which the barrier film 2 on the convex portion on the substrate is exposed as shown in FIG. 1(b) with the conductive material 3 being remained in the concave portion, is obtained. Depending on the polishing conditions, a slight amount of the conductive material is remained, and a part of the barrier film on the convex portion is not exposed (this state is not shown), but, since the CMP polishing liquid of the present invention is capable of polishing the conductive material, such state is not problematic at all insofar as a large part of the conductive material is removed.

The second polishing step, in which the obtained conductor pattern is polished by using the CMP polishing liquid of the present invention, is performed. In the second polishing step, by using the second CMP polishing liquid capable of polishing the conductive material, the barrier film, and the interlayer dielectrics, at least the exposed barrier film and the conductive material in the concave portions are polished. Thus, as shown in FIG. 1(c), the polishing is terminated when the barrier film covering the convex portions is removed to expose the entire interlayer dielectrics 1, thereby obtaining a substrate 30 after the termination of the polishing. The substrate 30 after the termination of polishing has the form wherein the conductive material 3 is embedded into the concave portions to be used as a metal wiring, and a section of the barrier film 2 is exposed at a boundary surface between the conductive material 3 and the interlayer dielectrics 1.

Here, it is possible to use the CMP polishing liquid of the present invention for both of the first CMP polishing liquid and the second CMP polishing liquid, but, in order to utilize the characteristics of having the favorable polishing speed for the interlayer dielectrics, it is preferable to use the CMP polishing liquid of the present invention at least as the second CMP polishing liquid.

Figure 4:
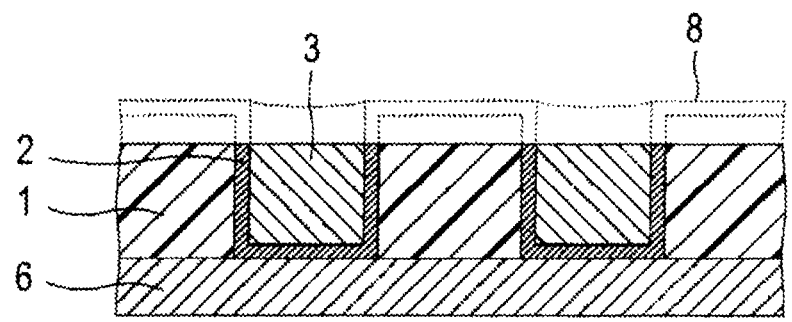
FIG. 4 is a sectional view schematically showing one example of overpolishing in a second polishing step.
Figure 5:
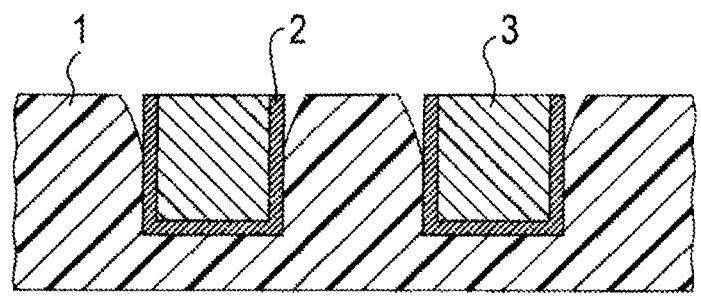
FIG. 5 is a sectional view schematically showing a seam which occurred after the polishing.

In order to ensure more excellent flatness in the substrate 30 after the termination of polishing, overpolishing (e.g., in the case where a time required for obtaining the target pattern in the second polishing step is 100 seconds, polishing for 50 seconds in addition to the 100 seconds of polishing is referred to as 50% overpolishing) may be performed for polishing to a depth including a part of the interlayer dielectrics at the convex portions as shown in FIG. 4.

In FIG. 4, the portion 8 on which the overpolishing is performed is indicated by a dotted line.

Interlayer dielectrics and a metal wiring of a second layer are further formed on the metal wiring formed as described above, and the same step is repeated for a predetermined number of times, thereby producing a semiconductor substrate having a desired number of wiring layers (not shown).

The CMP polishing liquid of the present invention may be used for polishing a silicon oxide film formed on a wiring board having a predetermined wiring, a glass, an inorganic insulation film of silicon nitride or the like, an optical glass such as photomask, lens, and prism, an inorganic conductive film such as ITO, optical integrated circuit, optical switching element, and optical waveguide each of which is formed of a glass and a crystalline material, an end face of an optical fiber, an optical single crystal such as scintillator, a solid laser single crystal, an LED sapphire substrate for blue laser, a semiconductor single crystal such as SiC, GaP, and GaAs, a glass substrate for magnetic disk, and a substrate of magnetic head or the like, without limitation to the polishing of the silicon compound film formed on the semiconductor substrate.

EXAMPLES

Hereinafter, the present invention will be described in conjunction with examples. However, the present invention is not limited by the examples.

Experiment 1

Polishing speeds and abrasive grain dispersion stabilities of various films were investigated by polishing the films using the CMP polishing liquid according to the first embodiment of the present invention.

(I-1: Preparation of CMP Polishing Liquid Concentrate)

To a container, 1.5 parts by bass of malic acid as an oxidized-metal dissolving agent and 0.6 part by mass of benzotriazole as a metal anticorrosive agent were placed, and X part by mass of ultrapure water was added, followed by stirring and mixing to dissolve the components. Each of colloidal silicas A to R shown in Tables 1 to 3 was added in an amount equivalent to 12.0 parts by mass as silica particles to obtain "CMP polishing liquid concentrates". Since the colloidal silicas had different solid contents (contents of silica particles), the X part by mass of ultrapure water was calculated in such a manner that an amount of the CMP polishing liquid concentrate became 100 parts by mass.

(I-2: Preparation of CMP Polishing Liquid)

To 100 parts by mass of the CMP polishing liquid concentrate, 200 parts by mass of ultrapure water was added for tripling dilution, thereby obtaining "slurry". Next, 2.66 parts by mass of 30 mass % hydrogen peroxide was added (in an amount equivalent to 0.8 part by mass as hydrogen peroxide), followed by stirring and mixing to prepare CMP polishing liquids of Examples 1-1 to 1-8 and Comparative Examples 1-1 to 1-10.

A biaxial average primary particle diameter (R), a BET specific surface area ($S_{BET}$), a silanol group density ($\rho$), an average particle diameter of secondary particles, an association degree, and a zeta potential ($\zeta$) of each of the colloidal silicas are as shown in Table 1 to Table 3.

(I-3: Measurement Method)

The characteristics of each of the colloidal silicas in Table 1 to Table 3 were examined as described below.

(1) Biaxial Average Primary Particle Diameter (R [nm])

An appropriate amount of a liquid of the colloidal silica was poured into a container, and a chip obtained by cutting a wafer with patterned wiring into pieces 2 by 2 centimeters square was dipped into the liquid for about 30 seconds and then transferred to pure water in another container for rinsing for 30 seconds, followed by drying by blowing nitrogen. After that, the chip was placed on a sample holder for scanning electron microscope (SEM) observation, and an acceleration voltage of 10 kV was applied to obtain an image of the observation of silica particles at a magnification of ×100000. From the obtained image, arbitrary 20 particles were selected. As shown in FIG. 2, a rectangle (circumscribed rectangle) 5 which was disposed in such a fashion that a long diameter thereof was the longest while circumscribing a silica particle 4 was derived. By setting the long diameter of the circumscribed rectangle 5 as X and a short diameter thereof as Y, the biaxial average primary particle diameter of the particle was calculated from (X+Y)/2. The operation was conducted for each of the 20 silica particles, and an average value of the obtained values was detected to be used as the biaxial average primary particle diameter.

(2) BET Specific Surface Area $S_{BET}$ [/g]

The colloidal silica was dried at 150° C. in a drier, pulverized by using a mortar, and then transferred to a measurement cell. After vacuum deaeration at 120° C. for 60 minutes, a multipoint method of utilizing nitrogen gas absorption was performed by using a BET specific surface area measurement apparatus (NOVA-1200; manufactured by Yuasa Ionics, Inc.).

(3) Silanol Group Density ($\rho$ [number/nm])

A liquid of the colloidal silica in such an amount that an amount of the silica particles contained in the liquid was 15 g was weighed, and a pH of the liquid was adjusted to pH3.0 to pH3.5 with hydrochloric acid. A mass content equivalent to 1/10 of the adjusted liquid was poured into another container (the silica amount A [g] at this state was 1.5 g), and 30 g of sodium chloride was added thereto, followed by adding ultrapure water till a total amount became 150 g. A pH of the liquid was adjusted to pH4.0 with a 0.1 mol/L sodium hydroxide solution to obtain a titration sample.

To the titration sample, the 0.1 mol/L sodium hydroxide solution was added dropwise until the pH reached to 9.0, and an amount of sodium hydroxide required for changing the pH from 4.0 to 9.0 was detected (B [mol]).

The above two values and the values of the BET specific surface area ($S_{BET}$ [m$^2$/g]) separately measured in (2) and the Avogadro number ($N_A$ [number/mol]) were assigned to the following expression (1) to calculate the silanol group density. Also, A is 1.5 [g] as described above.

$$\rho = B \cdot N_A / A \cdot S_{BET} \quad (1)$$

(in the expression (1), $N_A$ [number/mol] is the Avogadro number, and $S_{BET}$ [m$^2$/g] is the BET specific surface area of silica particles).

(4) Average Particle Diameter of Secondary Particles and Association Degree

A measurement sample was prepared by diluting 0.5 g of the CMP polishing liquid concentrate with 99.5 g of water (1:200 dilution). The measurement sample was measured by using a light diffracting and scattering type particle size distribution meter (trade name: COULTER N5 type) manufactured by Coulter Electronics, Inc., and a value of D50 was used as an average particle diameter of secondary particles (hereinafter referred to as average particle diameter). The average particle diameter was divided by the biaxial average primary particle diameter to obtain the association degree.

(5) Zeta Potential

A measurement sample was prepared by diluting the CMP polishing liquid obtained by "I-2: Preparation of CMP polishing Liquid" in such a manner that scattering intensity of the measurement sample in a measurement device (Delsa Nano C manufactured by Beckman Coulter, Inc.) was $1.0 \times 10^4$ to $5.0 \times 10^4$ cps. More specifically, the measurement sample was obtained by diluting the CMP polishing liquid with pure water in such a manner that 1.71 parts by mass of the colloidal silica was contained in 100 parts by mass of the CMP polishing liquid, and the measurement sample was placed in a zeta potential measurement cell to conduct the measurement.

(II-1: Polishing Speed)

The following 3 types of blanket substrates (blanket substrates a to c) were polished and washed under the following polishing conditions by using the CMP polishing liquid obtained by (I-1).

(Blanket Substrate)

Blanket Substrate (a)

A silicon substrate on which silicon dioxide having a thickness of 1000 nm was formed by CVD.

Blanket Substrate (b)

A silicon substrate on which a tantalum nitride film having a thickness of 200 nm was formed by sputtering.

Blanket Substrate (c)

A silicon substrate on which a copper film having a thickness of 1600 nm was formed by sputtering.

(Polishing Conditions)

Polishing/washing apparatus: CMP polisher, Reflexion LK (manufactured by AMAT, Inc.)

Polishing pad: Foamed polyurethane resin (product name: IC1010; manufactured by Rohm and Haas)

Platen Rotation Number: 93/min

Head Rotation Number: 87/min

Polishing pressure: 10 kPa

Supply amount of CMP polishing liquid: 300 ml/min

Polishing time: 90 sec for blanket substrate (a), 30 sec for blanket substrate (b), and 120 sec for blanket substrate (c).

A polishing speed for each of the three types of blanket substrates after the polishing and washing was detected as described below to detect the polishing speed for each of the films. The measurement results of polishing speed are shown in Table 1 to Table 3.

Film thicknesses before and after the polishing of the blanket substrate (a) were measured by using a film thickness measurement apparatus RE-3000 (manufactured by Dainippon Screen Mfg. Co., Ltd.), and the polishing speed was detected from a difference between the film thicknesses.

Film thicknesses before and after the polishing of each of the blanket substrate (b) and the blanket substrate (c) were measured by using a metal film thickness measurement apparatus (Type VR-120/085 manufactured by Hitachi Kokusai Electric, Inc.), and the polishing speed was detected from a difference between the film thicknesses.

(II-2: Dispersion Stability Evaluation)

Each of the CMP polishing liquid concentrates prepared in (I-1) was stored in a thermostat bath at 60° C. for 2 weeks, and then presence/absence of sedimentation of abrasive grain was confirmed by visual examination. Also, an average diameter of secondary particles after the storage in thermostat bath at 60° C. for 2 weeks was measured in the same manner as described above, and a particle diameter growth rate (%) was calculated by dividing the average particle diameter after storage by the average particle diameter before storage.

The results are shown in Table 1 to Table 3.

TABLE 1

| | | Example No. | | | | | | | |
| --- | --- | --- | --- | --- | --- | --- | --- | --- | --- |
| | | 1-1 | 1-2 | 1-3 | 1-4 | 1-5 | 1-6 | 1-7 | 1-8 |
| Property of abrasive grain | Type of abrasive grain | A | B | C | D | L | M | N | O |
| | Biaxial Average Primary Particle Diameter R [nm] | 45.5 | 46.5 | 46.5 | 49.5 | 47.0 | 35.0 | 40.0 | 29.0 |
| | BET Specific Surface Area $S_{BET}$ [m²/g] | 80.0 | 80.0 | 68.9 | 64.7 | 66.0 | 128 | 107 | 108 |
| | Silanol Group Density ρ [number/nm²] | 1.6 | 1.7 | 4.6 | 4.6 | 1.8 | 3.1 | 3.8 | 1.6 |
| | Average Particle Diameter [nm] | 74 | 75 | 52 | 53 | 70 | 39 | 47 | 49 |
| | Association Degree | 1.72 | 1.67 | 1.12 | 1.11 | 1.49 | 1.11 | 1.18 | 1.67 |
| | Zeta Potential [mV] | 20 | 19 | 11 | 12 | 21 | 12 | 12 | 16 |
| Polishing Speed [nm/min] | Silicon dioxide [blanket substrate(a)] | 123 | 120 | 98 | 97 | 109 | 94 | 97 | 115 |
| | Tantalum nitride [blanket substrate(b)] | 105 | 100 | 85 | 84 | 94 | 89 | 89 | 100 |
| | Copper [blanket substrate(c)] | 36 | 35 | 39 | 36 | 38 | 38 | 29 | 37 |
| Dispersion Stability | Sedimentation | absent | absent | absent | absent | absent | absent | absent | absent |
| | Particle diameter growth rate (%) | 1 | 7 | 15 | 5 | 2 | 15 | 11 | 7 |

TABLE 2

| | | Comparative Example No. | | | | |
| --- | --- | --- | --- | --- | --- | --- |
| | | 1-1 | 1-2 | 1-3 | 1-4 | 1-5 |
| Property of abrasive grain | Type of abrasive grain | E | F | G | H | I |
| | Biaxial Average Primary Particle Diameter R [nm] | 27.5 | 61.3 | 47.1 | 46.4 | 21.5 |
| | BET Specific Surface Area $S_{BET}$ [m²/g] | 122 | 69.5 | 70.5 | 75.9 | 162 |
| | Silanol Group Density ρ [number/nm²] | 2.8 | 4.6 | 5.2 | 7.0 | 3.4 |

TABLE 2-continued

|  |  | Comparative Example No. | | | | |
| --- | --- | --- | --- | --- | --- | --- |
|  |  | 1-1 | 1-2 | 1-3 | 1-4 | 1-5 |
|  | Average Particle Diameter [nm] | 28 | 65 | 51 | 64 | 28 |
|  | Association Degree | 1.02 | 1.06 | 1.08 | 1.38 | 1.30 |
|  | Zeta Potential [mV] | 12 | 11 | 5 | 1 | 2 |
| Polishing Speed [nm/min] | Silicon dioxide [blanket substrate(a)] | 43 | 67 | 58 | 67 | 31 |
|  | Tantalum nitride [blanket substrate(b)] | 81 | 84 | 83 | 81 | 80 |
|  | Copper [blanket substrate(c)] | 34 | 37 | 35 | 35 | 36 |
| Dispersion Stability | Sedimentation | absent | absent | present | present | present |
|  | Particle diameter growth rate (%) | 121 | 14 | 33 | 325 | 168 |

TABLE 3

|  |  | Comparative Example No. | | | | |
| --- | --- | --- | --- | --- | --- | --- |
|  |  | 1-6 | 1-7 | 1-8 | 1-9 | 1-10 |
|  | Type of abrasive grain | J | K | P | Q | R |
| Property of abrasive grain | Biaxial Average Primary Particle Diameter R [nm] | 45.4 | 43.8 | 67.0 | 89.0 | 26.0 |
|  | BET Specific Surface Area $S_{BET}$ [m²/g] | 79.1 | 91.0 | 83.2 | 45.8 | 137 |
|  | Silanol Group Density ρ [number/nm²] | 6.5 | 5.2 | 4.6 | 4.0 | 1.6 |
|  | Average Particle Diameter [nm] | 55 | 78 | 72 | 103 | 27 |
|  | Association Degree | 1.21 | 1.78 | 1.07 | 1.16 | 1.02 |
|  | Zeta Potential [mV] | 0 | 1 | 14 | 9 | 15 |
| Polishing Speed [nm/min] | Silicon dioxide [blanket substrate(a)] | 68 | 60 | 67 | 36 | 34 |
|  | Tantalum nitride [blanket substrate(b)] | 82 | 81 | 82 | 41 | 84 |
|  | Copper [blanket substrate(c)] | 36 | 35 | 38 | 35 | 34 |
| Dispersion Stability | Sedimentation | present | present | absent | present | absent |
|  | Particle diameter growth rate (%) | 136 | 195 | 14 | 254 | 15 |

(III) Evaluation Result

It is apparent that the CMP polishing liquids obtained by using the colloidal silicas of Examples 1-1 to 1-8 exhibit favorable polishing speeds of 84 to 105 nm/min for the tantalum nitride film used as the barrier film and a favorable polishing speeds of 94 to 123 nm/min for the silicon dioxide film used as the interlayer dielectrics and exhibit the excellent dispersion stability even when the abrasive grain (silica particles) content in the liquid is high.

In contrast, Comparative Examples 1-1 to 1-10 are silica particles each of which do not satisfy any one of the required particle properties, i.e. 5.0/nm or less of silanol group density, 25 to 55 nm of biaxial average primary particle diameter, and 1.1 or more association degree. Some of Comparative Examples have favorable dispersion stability but others do not, and the interlayer dielectric polishing speeds of Comparative Examples were 31 to 68 nm/min which were inferior to the CMP polishing liquids of Examples 1-1 to 1-8.

Experiment 2

A polishing speed for each of layers and a seam amount in the case of polishing a semiconductor substrate having a wiring pattern using the CMP polishing liquid according to the second embodiment of the present invention were examined.

(IV-1: Preparation of CMP Polishing Liquid)

To a container, 0.4 part by mass of malic acid as an oxidized-metal dissolving agent and 0.1 part by mass of any one of metal anticorrosive agents shown in Table 4 to Table 6 were placed, and X part by mass of ultrapure water was poured into the container. Further, 1.4 parts by mass of 3-methoxy-3-methyl-1-butanol as a solubilizing agent was added, and a 36.5% PMAA solution was added so that 0.02 part by mass of PMAA was contained, followed by stirring and mixing to dissolve all of the components.

As used herein, in Tables, "BTA" is benzotriazole; "HBTA" is 1-hydroxybenzotriazole; and "ABTA" is 1H-1,2, 3-triazolo[4,5-b]pyridine. The PMAA is a copolymer of methacrylic acid and acrylic acid (copolymerization ratio: 99/1; weight average molecular weight: 7500).

Each of colloidal silicas shown in Tables 4 to 6 was added in an amount equivalent to 3.0 parts by mass as silica particles to obtain 100 parts by mass of a slurry. Since the colloidal silicas had different solid contents (contents of silica particles), the X part by mass of ultrapure water was calculated in such a manner that the amount of the slurry became 100 parts by mass.

Next, 0.33 part by mass of 30 mass % hydrogen peroxide was added (in an amount equivalent to 0.1 part by mass as hydrogen peroxide), followed by stirring and mixing to prepare CMP polishing liquids of Examples 2-1 to 2-13 and Comparative Examples 2-1 to 2-9.

Values of a biaxial average primary particle diameter (R), a silanol group density (ρ), an average particle diameter, an association degree, and a zeta potential (ζ) of each of the colloidal silicas shown in Table 4 to Table 6 were examined in the same manner as in Experiment 1.

(V-1: Polishing Amount)

A patterned substrate (SEMATECH 754 manufactured by ADVANTECH) having the size of a diameter of 12 inches (30.5 cm) (φ) was prepared (film thickness: 1000 nm of Cu, 25 nm of Ta, 500 nm of TEOS). The substrate had a silicon substrate, interlayer dielectrics made from silicon dioxide and having a pattern of which a step between a projected portion and a groove portion was 500 nm, a barrier film made from 25 nm of tantalum nitride orderly formed on the dielectrics by sputtering, and 1.2 μm of a copper film formed on the barrier film.

The copper of the substrate was polished until the barrier layer was exposed by using a known copper polishing agent. A patterned region having a copper wiring portion having a width of 100 μm and an interlayer dielectric portion having a width of 100 μm of the patterned substrate was cut into pieces 2 by 2 centimeters square to obtain substrates for evaluation. Each of the evaluation substrates was polished by dripping each of the CMP polishing liquids onto a pad attached to a platen of a polishing apparatus under the following polishing conditions. The polishing was terminated when a dishing at the copper wiring portion became 20 nm or less. Polishing amounts of the barrier layer and the interlayer dielectrics and a seam amount after the polishing were evaluated.

The polishing conditions are as follows.
Polishing apparatus: IMPTEC 10DVT (wrapping machine manufactured by Engis Japan Corporation)
Polishing pad: Swede-like foamed polyurethane resin polishing pad
Polishing pressure: 30 kPa
Platen rotation speed: 90 rpm
Polishing liquid supply amount: 15 ml/min (Polishing Amount Measurement Method)

In the patterned substrate polished under the above-described conditions, polishing amounts of the barrier layer and the interlayer dielectric at the projected portion of the interlayer dielectric were measured by using Nanospec M5000 which is a desktop optical interferometry type film thickness measurement system manufactured by Nanometrics Incorporated.

Results are shown in Table 4 to Table 6.

(V-2: Seam Amount)

In the substrate after the polishing, the copper wiring portion having the wiring width of 100 μm and the interlayer dielectric pattern having the wiring width of 100 μm were scanned by a contact type step meter (P-16 manufactured by KLA-Tencor Japan) to measure an amount of a step where the interlayer dielectric portion near the copper wiring was excessively polished. For the "dishing", a difference between a film thickness of the interlayer dielectric portion and a film thickness of the wiring portion was measured in the same manner.

Results are shown in Table 4 to Table 6.

TABLE 4

| | | Example No. | | | | | |
|---|---|---|---|---|---|---|---|
| | | 2-1 | 2-2 | 2-3 | 2-4 | 2-5 | 2-6 |
| Type of abrasive grain | | C | C | C | U | M | N |
| Type of metal anticorrosive agent | | BTA | HBTA | ABTA | HBTA | HBTA | HBTA |
| Property of abrasive grain | Biaxial Average Primary Particle Diameter R [nm] | 47 | 47 | 47 | 22 | 35 | 40 |
| | Silanol Group Density ρ [number/nm$^2$] | 4.6 | 4.6 | 4.6 | 2.3 | 3.1 | 3.8 |
| | Average Particle Diameter [nm] | 52 | 52 | 52 | 26 | 39 | 47 |
| | Association Degree | 1.12 | 1.12 | 1.12 | 1.18 | 1.11 | 1.18 |
| | Zeta Potential [mV] | 11.0 | 10.9 | 10.9 | 5.5 | 9.1 | 10.7 |
| | Surface treatment | absent | absent | absent | absent | absent | absent |
| Polishing Results of patterned substrate | Polishing Amount of tantalum [nm] | 25 | 25 | 25 | 25 | 25 | 25 |
| | Polishing Amount of silicon dioxide [nm] | 61 | 69 | 51 | 68 | 66 | 63 |
| | Seam Amount [nm] | 19 | 19 | 13 | 19 | 15 | 23 |

TABLE 5

| | Example No. | | | | | | |
|---|---|---|---|---|---|---|---|
| | 2-7 | 2-8 | 2-9 | 2-10 | 2-11 | 2-12 | 2-13 |
| Type of abrasive grain | A | L | L | O | R | R | R |
| Type of metal anticorrosive agent | HBTA | HBTA | ABTA | HBTA | BTA | HBTA | ABTA |

TABLE 5-continued

| | | \multicolumn{7}{c}{Example No.} | | | | | | |
|---|---|---|---|---|---|---|---|---|
| | | 2-7 | 2-8 | 2-9 | 2-10 | 2-11 | 2-12 | 2-13 |
| Property of abrasive grain | Biaxial Average Primary Particle Diameter R [nm] | 43 | 47 | 47 | 29 | 26 | 26 | 26 |
| | Silanol Group Density ρ [number/nm²] | 1.6 | 1.8 | 1.8 | 1.6 | 1.6 | 1.6 | 1.6 |
| | Average Particle Diameter [nm] | 74 | 70 | 70 | 49 | 27 | 27 | 27 |
| | Association Degree | 1.72 | 1.49 | 1.49 | 1.67 | 1.02 | 1.02 | 1.02 |
| | Zeta Potential [mV] | 18.7 | 19.9 | 21.3 | 13.4 | 11.7 | 11.7 | 11.7 |
| | Surface treatment | absent | absent | absent | absent | absent | absent | absent |
| Polishing Results of patterned substrate | Polishing Amount of tantalum [nm] | 25 | 25 | 25 | 25 | 25 | 25 | 25 |
| | Polishing Amount of silicon dioxide [nm] | 84 | 53 | 71 | 67 | 66 | 54 | 50 |
| | Seam Amount [nm] | 13 | 12 | 8 | 20 | 13 | 14 | 12 |

TABLE 6

| | | \multicolumn{9}{c}{Comparative Example No.} | | | | | | | | |
|---|---|---|---|---|---|---|---|---|---|---|
| | | 2-1 | 2-2 | 2-3 | 2-4 | 2-5 | 2-6 | 2-7 | 2-8 | 2-9 |
| Type of abrasive grain | | P | H | S | T | T | T | I | V | W |
| Type of metal anticorrosive agent | | | HBTA | | BTA | HBTA | ABTA | | HBTA | |
| Property of abrasive grain | Biaxial Average Primary Particle Diameter R [nm] | 67 | 46 | 32 | 34 | 34 | 34 | 22 | 46 | 46 |
| | Silanol Group Density ρ [number/nm²] | 4.6 | 7.0 | 1.7 | 1.8 | 1.8 | 1.8 | 3.4 | 5.8 | 5.5 |
| | Average Particle Diameter [nm] | 72 | 64 | 39 | 45 | 45 | 45 | 28 | 68 | 66 |
| | Association Degree | 1.07 | 1.38 | 1.23 | 1.33 | 1.33 | 1.33 | 1.30 | 1.47 | 1.47 |
| | Zeta Potential [mV] | 12.6 | 0.0 | 14.0 | 16.8 | 16.8 | 16.8 | 2.0 | −22.0 | 18.0 |
| | Surface treatment | absent | absent | absent | absent | absent | absent | absent | present | present |
| Polishing Results of patterned substrate | Polishing Amount of tantalum [nm] | 25 | 25 | 25 | 25 | 25 | 25 | 25 | 25 | 25 |
| | Polishing Amount of silicon dioxide [nm] | 47 | 0 | 34 | 35 | 23 | 38 | 9 | 7 | 10 |
| | Seam Amount [nm] | 21 | 20 | 22 | 17 | 22 | 16 | 32 | 48 | 40 |

Since the thickness of the barrier layer was 25 nm in the patterned substrate after the polishing, the barrier layer at the projected portion of the interlayer dielectrics was entirely removed in the patterned substrates having the tantalum nitride polishing amount of 25 nm in Tables 4 to 6. The silicon dioxide polishing amount indicates a polishing amount of silicon dioxide positioned below the polished barrier film, and the larger value means the better interlayer dielectric polishing speed.

As is apparent from Table 4 to Table 6, the CMP polishing liquids of Examples 2-1 to 2-13 which satisfy the requirements of the biaxial average primary particle diameter, silanol group density, association degree, and surface treatment are capable of attaining the favorable tantalum nitride polishing speed and silicon dioxide polishing speed while reducing the seam.

The CMP polishing liquids of Comparative Examples 2-1 to 2-9 were capable of polishing the barrier layer, but at least one of the silicon dioxide polishing amount and seam amount of each of the CMP polishing liquids was inferior to Examples 2-1 to 2-13. More specifically, Comparative Example 2-1 failed to attain the satisfactory silicon dioxide polishing amount and the reduced seam amount since the biaxial average primary particle diameter thereof was larger than 60 nm.

Comparative Example 2-2 failed to attain the satisfactory silicon dioxide polishing amount since the mechanical polishing between the silica particles and the interlayer dielectrics is weakened due to the relatively low "hardness" as the silica particles which was caused by the silanol group density of larger than 5.

Comparative Examples 2-3 to 2-7 failed to attain the satisfactory silicon dioxide polishing amount since the association degree was not kept to 1.20 or less or between 1.40 and 1.80.

Comparative Example 2-7 failed to attain the satisfactory silicon dioxide polishing amount and increased the seam amount since the association degree was not kept to 1.20 or less or between 1.40 and 1.80.

Comparative Examples 2-8 and 2-9 failed to attain the satisfactory silicon dioxide polishing amount and seam amount since they are abrasive grains for surface treatment of abrasive grain.

Experiment 3

It was confirmed that the evaluation results of the CMP polishing liquids according to the second embodiment were correlated with the evaluation results obtained by using 12-inch wafers. More specifically, polishing properties on the following substrates were evaluated by using the CMP polishing liquids of Examples 2-2, 2-5, and 2-8 of Experiment 2.
(Blanket Substrate)
Blanket substrates (a), (b), and (c) which are the same as those used in Experiment 1 were used.
(Patterned Substrate)
A patterned substrate (SEMATECH 754 manufactured by ADVANTECH) having the size of a diameter of 12 inches (30.5 cm) (φ), in which a barrier layer was exposed in accordance with the first polishing step.
(Blanket Substrate Polishing Conditions)
Polishing/washing apparatus: CMP polisher (Reflexion LK manufactured by AMAT, Inc.)
Polishing pad: Foamed polyurethane resin (product name: IC1010; manufactured by Rohm and Haas)
Polishing pressure: 10 kPa
Platen Rotation Number: 93/min
Head Rotation Number: 87/min
Supply amount of CMP polishing liquid: 300 ml/min
Polishing time: 90 sec for blanket substrate (a), 30 sec for blanket substrate (b), and 120 sec for blanket substrate (c)
(Patterned Substrate Polishing Conditions)
Polishing/washing apparatus: CMP polisher, Reflexion LK (manufactured by AMAT, Inc.)
Polishing pad: Foamed polyurethane resin with closed pores (product name: IC1010; manufactured by Rohm and Haas)
Polishing pressure: 10 kPa
Platen Rotation Number: 93/min
Head Rotation Number: 87/min
Supply amount of CMP polishing liquid: 300 ml/min
Polishing time: For the time period shown in Table 7 by setting the time required for the dishing of 20 nm or less as a target time.

(Blanket Substrate Polishing Speed)
The blanket substrate polishing speed was detected in the same manner as in Experiment 1.
(Patterned Substrate Polishing Property)
The dishing amount and the seam amount of each of the patterned substrates after the polishing were evaluated by the following method.
(Dishing Evaluation Method)
In the patterned substrate after polishing, the copper wiring portion having the wiring width of 100 μm and the interlayer dielectric pattern having the wiring width of 100 μm were scanned by a contact type step meter (P-16 manufactured by KLA-Tencor Japan) to measure a difference between a film thickness of the interlayer dielectric portion and a film thickness of the wiring portion, and the difference was the dishing amount.
(Seam Evaluation Method)
In the patterned substrate after polishing, the copper wiring portion having the wiring width of 100 μm and the interlayer dielectric pattern having the wiring width of 100 μm were scanned by a contact type step meter (P-16 manufactured by KLA-Tencor Japan) to measure an amount of a step formed by excessive polishing of the interlayer dielectric portion near the copper wiring.
Results are shown in Table 7.

TABLE 7

| | Example No. | 3-2 | 3-5 | 3-8 |
|---|---|---|---|---|
| | Type of abrasive grain | C | M | L |
| Polishing Speed [nm/min] | Silicon dioxide [blanket substrate (a)] | 74 | 72 | 83 |
| | Tantalum nitride [blanket substrate (b)] | 57 | 60 | 66 |
| | Copper [blanket substrate (c)] | 40 | 39 | 39 |
| Flatness Evaluation | Polishing Time [min] | 65 | 50 | 65 |
| | Dishing Amount [nm] | 0 | 5 | 0 |
| | Seam Amount [nm] | 15 | 12 | 10 |

As is apparent from Table 7, each of the CMP polishing liquids which attained the excellent interlayer dielectric polishing speed and barrier layer polishing speed as well as the reduced seam amount in Experiment 2 was also excellent in interlayer dielectric polishing speed and barrier layer polishing speed and reduced the seam in the 12 inch wafer evaluation.

INDUSTRIAL APPLICABILITY

According to the present invention, it is possible to obtain the CMP polishing liquid which has the high barrier film polishing speed, the favorable abrasive grain dispersion stability, and the high interlayer dielectric polishing speed, and, therefore, improvement in throughput is realized owing to the reduction in time required for polishing step. Also, the polishing method of the present invention which uses the CMP polishing liquid for chemical mechanical polishing is suitably employed for producing semiconductor substrates and other electronic devices which have high productivity, excellent microfabrication, thin film formation, dimension accuracy, and electric property, and high reliability.

DESCRIPTION OF REFERENCE NUMERALS

1: interlayer dielectrics
2: barrier film
3: conductive material

4: particle
5: circumscribed rectangle
6: silicon substrate
7: concave portion
8: overpolished portion
10: substrate
20: substrate in which conductor pattern is exposed
30: substrate after termination of polishing
X: long diameter of circumscribed rectangle
Y: short diameter of circumscribed rectangle

What is claimed is:

1. A polishing method comprising:
a polishing step of removing at least a part of a barrier conductive film and a part of an interlayer dielectric by supplying a CMP polishing liquid, wherein the CMP polishing liquid comprises a medium and silica particles as an abrasive grain dispersed into the medium, wherein:
(A2) the silica particles have a silanol group density of less than $5.0/nm^2$ and are not subjected to any surface treatment;
(B2) a biaxial average primary particle diameter when arbitrary 20 silica particles are selected from an image obtained by scanning electron microscope observation is 60 nm or less; and
(C2) an association degree of the silica particles is 1.20 or less or from 1.40 to 1.80.

2. A polishing method comprising:
a mixing step of mixing a CMP polishing liquid concentrate with a diluting liquid, an additive liquid, or both of the diluting liquid and the additive liquid to prepare a CMP polishing liquid at a 3-fold dilution or a higher; and
a polishing step of removing at least a part of a barrier conductive film and a part of an interlayer dielectric by supplying the CMP polishing liquid, wherein the CMP polishing liquid comprises a medium and silica particles as an abrasive grain dispersed into the medium, wherein:
(A2) the silica particles have a silanol group density of less than $5.0/nm^2$ and are not subjected to any surface treatment;
(B2) a biaxial average primary particle diameter when arbitrary 20 silica particles are selected from an image obtained by scanning electron microscope observation is 60 nm or less; and
(C2) an association degree of the silica particles is 1.20 or less or from 1.40 to 1.80.

3. The polishing method according to claim 1 comprising:
a first polishing step of exposing the barrier conductive film on a convex portion by polishing a conductive material of a substrate comprising the interlayer dielectric having a concave portion and the convex portion on a surface thereof, the barrier conductive film coating the interlayer dielectric along the surface, and the conductive material coating the barrier conductive film by filling the concave portion; and
a second polishing step of exposing the interlayer dielectric of the convex portion by polishing the barrier conductive film at least on the convex portion, characterized in that the polishing is performed by supplying the CMP polishing liquid at least in the second polishing step.

4. The polishing method according to claim 3, wherein the interlayer dielectric is a silicon coating or an organic polymer film.

5. The polishing method according to claim 3, wherein the conductive material contains copper as a main component.

6. The polishing method according to claim 1, wherein the barrier conductive film prevents the conductive material from diffusing into the interlayer dielectric and contains at least one selected from the group consisting of tantalum, tantalum nitride, a tantalum alloy, other tantalum compounds, titanium, titanium nitride, a titanium alloy, other titanium compounds, ruthenium, and other ruthenium compounds.

7. The polishing method according to claim 3, wherein a part of the interlayer dielectric on the convex portion is further polished in the second polishing step.

8. The polishing method according to claim 1 wherein a semiconductor substrate is produced by employing the polishing method.

9. The polishing method according to claim 1 wherein an electronic device is produced by employing the polishing method.

10. The polishing method according to claim 1, further comprising a metal anticorrosive agent.

11. The polishing method according to claim 10, wherein the metal anticorrosive agent is a compound having a triazole skeleton.

12. The polishing method according to claim 10, wherein the metal anticorrosive agent is at least one selected from the group consisting of benzotriazole and 1H-1,2,3-triazolo[4,5-b]pyridine.

13. The polishing method according to claim 1, wherein the silica particles have a zeta potential in the CMP polishing liquid of 5 mV or more.

14. The polishing method according to claim 1, wherein each silica particle is a colloidal silica.

15. The polishing method according to claim 1, wherein a content of the silica particles is 3.0 to 8.0 parts by mass relative to 100 parts by mass of the CMP polishing liquid.

16. The polishing method according to claim 1, wherein a pH of the CMP polishing liquid is in a neutral range or an acidic range.

17. The polishing method according to claim 1, wherein the CMP polishing liquid further comprises an oxidized-metal dissolving agent.

18. The polishing method according to claim 1, wherein the CMP polishing liquid further comprises an oxidizing agent.

19. The polishing method according to claim 2, wherein 5 parts by mass or more of the abrasive grain is contained in the CMP polishing liquid concentrate.

20. The polishing method according to claim 2, wherein the polishing step comprising:
a first polishing step of exposing a barrier conductive film on a convex portion by polishing a conductive material of a substrate comprising the interlayer dielectric having a concave portion and the convex portion on a surface thereof, the barrier conductive film coating the interlayer dielectric along the surface, and the conductive material coating the barrier conductive film by filling the concave portion; and
a second polishing step of exposing the interlayer dielectric of the convex portion by polishing the barrier conductive film at least on the convex portion, and
wherein the polishing is performed by supplying the CMP polishing liquid at least in the second polishing step.

21. The polishing method according to claim 20, wherein the interlayer dielectric is a silicon coating or an organic polymer film.

22. The polishing method according to claim 20, wherein the conductive material contains copper as a main component.

23. The polishing method according to claim 2, wherein
the barrier conductive film prevents the conductive material from diffusing into the interlayer dielectric and contains at least one selected from the group consisting of tantalum, tantalum nitride, a tantalum alloy, other tantalum compounds, titanium, titanium nitride, a titanium alloy, other titanium compounds, ruthenium, and other ruthenium compounds.

24. The polishing method according to claim 20, wherein a part of the interlayer dielectric on the convex portion is further polished in the second polishing step.

25. The polishing method according to claim 2 wherein a semiconductor substrate is produced by employing the polishing method.

26. The polishing method according to claim 2 wherein an electronic device is produced by employing the polishing method.

27. The polishing method according to claim 2, further comprising a metal anticorrosive agent.

28. The polishing method according to claim 27, wherein the metal anticorrosive agent is a compound having a triazole skeleton.

29. The polishing method according to claim 27, wherein the metal anticorrosive agent is at least one selected from the group consisting of benzotriazole and 1H-1,2,3-triazolo[4,5-b]pyridine.

30. The polishing method according to claim 2, wherein the silica particles have a zeta potential in the CMP polishing liquid of 5 mV or more.

31. The polishing method according to claim 2, wherein each silica particle is a colloidal silica.

32. The polishing method according to claim 2, wherein a content of the silica particles is 3.0 to 8.0 parts by mass relative to 100 parts by mass of the CMP polishing liquid.

33. The polishing method according to claim 2, wherein a pH of the CMP polishing liquid is in a neutral range or an acidic range.

34. The polishing method according to claim 2, wherein the CMP polishing liquid further comprises an oxidized-metal dissolving agent.

35. The polishing method according to claim 2, wherein the CMP polishing liquid further comprises an oxidizing agent.

36. The polishing method of claim 1, wherein (A2) the silica particles have a silanol group density of $4.6/nm^2$ or less.

37. The polishing method of claim 2, wherein (A2) the silica particles have a silanol group density of $4.6/nm^2$ or less.

* * * * *